United States Patent
Shimohara

(10) Patent No.: US 12,389,549 B2
(45) Date of Patent: Aug. 12, 2025

(54) MANUFACTURING METHOD OF ELECTRONIC DEVICE

(71) Applicant: FUJIFILM Corporation, Tokyo (JP)

(72) Inventor: Norihide Shimohara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 31 days.

(21) Appl. No.: 18/583,868

(22) Filed: Feb. 22, 2024

(65) Prior Publication Data

US 2024/0206077 A1 Jun. 20, 2024

Related U.S. Application Data

(63) Continuation of application No. PCT/JP2022/019694, filed on May 9, 2022.

(30) Foreign Application Priority Data

Aug. 30, 2021 (JP) ................................ 2021-139985

(51) Int. Cl.
*H05K 3/12* (2006.01)
*C09D 11/037* (2014.01)
(Continued)

(52) U.S. Cl.
CPC ........... *H05K 3/125* (2013.01); *C09D 11/037* (2013.01); *C09D 11/101* (2013.01);
(Continued)

(58) Field of Classification Search
None
See application file for complete search history.

(56) References Cited

U.S. PATENT DOCUMENTS

| | | | |
|---|---|---|---|
| 2008/0160183 A1* | 7/2008 | Ide | H01L 24/37 252/500 |
| 2008/0174013 A1 | 7/2008 | Yang et al. | |

(Continued)

FOREIGN PATENT DOCUMENTS

| | | |
|---|---|---|
| JP | 2010087146 | 4/2010 |
| JP | 2013247339 | 12/2013 |

(Continued)

OTHER PUBLICATIONS

"International Search Report (Form PCT/ISA/210) of PCT/JP2022/019694", mailed on Aug. 2, 2022, with English translation thereof, pp. 1-7.

(Continued)

*Primary Examiner* — Austin Murata
(74) *Attorney, Agent, or Firm* — JCIPRNET

(57) ABSTRACT

Provided is a manufacturing method of an electronic device, the method including: a step of preparing an electronic substrate including a wiring board, an electronic component disposed on the wiring board, and a ground electrode having an organic acid on a surface thereof; and a step of applying an ink for forming a conductive layer onto at least a part of the ground electrode having the organic acid on the surface thereof, to form a conductive layer that is a cured film of the ink for forming a conductive layer, in which the organic acid includes at least one compound selected from the group consisting of a monocarboxylic acid having a molecular weight of less than 350 and a dicarboxylic acid having a molecular weight of less than 350.

8 Claims, 3 Drawing Sheets

(51) Int. Cl.
*C09D 11/101* (2014.01)
*C09D 11/102* (2014.01)
*C09D 11/107* (2014.01)
*C09D 11/322* (2014.01)
*C09D 11/52* (2014.01)
*C09D 11/54* (2014.01)
*H01L 21/56* (2006.01)
*H01L 23/552* (2006.01)
*H05K 1/02* (2006.01)
*H05K 3/28* (2006.01)
*H05K 1/09* (2006.01)

(52) U.S. Cl.
CPC .......... *C09D 11/102* (2013.01); *C09D 11/107* (2013.01); *C09D 11/322* (2013.01); *C09D 11/52* (2013.01); *C09D 11/54* (2013.01); *H01L 21/56* (2013.01); *H01L 23/552* (2013.01); *H05K 1/0218* (2013.01); *H05K 3/1208* (2013.01); *H05K 3/284* (2013.01); *H05K 1/095* (2013.01); *H05K 2201/0715* (2013.01); *H05K 2203/1469* (2013.01)

(56) References Cited

U.S. PATENT DOCUMENTS

| | | |
|---|---|---|
| 2008/0176359 A1 | 7/2008 | Molkkari et al. |
| 2010/0078209 A1 | 4/2010 | Inoue |
| 2013/0187293 A1* | 7/2013 | Sakai ................ H01L 21/67069 250/492.1 |
| 2016/0286647 A1 | 9/2016 | Hoang et al. |
| 2018/0049311 A1 | 2/2018 | Hoang et al. |
| 2020/0168476 A1 | 5/2020 | Kamada et al. |
| 2020/0299523 A1 | 9/2020 | Umeda et al. |
| 2021/0136963 A1 | 5/2021 | Behl et al. |

FOREIGN PATENT DOCUMENTS

| | | |
|---|---|---|
| JP | 2017179361 | 10/2017 |
| JP | 3216100 | 5/2018 |
| JP | 2021072438 | 5/2021 |
| WO | 2018207862 | 11/2018 |

OTHER PUBLICATIONS

"Written Opinion of the International Searching Authority (Form PCT/ISA/237) of PCT/JP2022/019694", mailed on Aug. 2, 2022, with English translation thereof, pp. 1-10.

* cited by examiner

MANUFACTURING METHOD OF ELECTRONIC DEVICE

CROSS-REFERENCE TO RELATED APPLICATION

This application is a Continuation of International Application No. PCT/JP2022/019694, filed May 9, 2022, which claims priority to Japanese Patent Application No. 2021-139985 filed Aug. 30, 2021. Each of the above applications is hereby expressly incorporated by reference, in its entirety, into the present application.

BACKGROUND OF THE INVENTION

1. Field of the Invention

The present disclosure relates to a manufacturing method of an electronic device.

2. Description of the Related Art

An electronic component needs to be shielded from interference with electromagnetic waves from other electronic apparatuses, and is generally covered with a shielding can. The shielding can has problems such as being thick, heavy, and having a small degree of freedom in design, and thus, there is a demand for an alternative technique for the shielding can.

For example, JP2017-179361A discloses a conductive paint that can be sprayed to form a shield layer, the conductive paint containing at least: (A) 100 parts by mass of a binder component including 5 to 30 parts by mass of a solid epoxy resin that is a solid at a normal temperature and 20 to 90 parts by mass of a liquid epoxy resin that is a liquid at the normal temperature in a total amount not exceeding 100 parts by mass; (B) 200 to 1800 parts by mass of silver-coated copper alloy particles which are copper alloy particles coated with a silver-containing layer, in which the copper alloy particles are made of an alloy of copper, nickel, and zinc, the silver-coated copper alloy particles have a nickel content of 0.5% to 20% by mass, and the silver-coated copper alloy particles have a zinc content of 1% to 20% by mass; and (C) 0.3 to 40 parts by mass of a curing agent.

SUMMARY OF THE INVENTION

In a case in which a conductive layer is provided on an electronic substrate, there is a demand for improving adhesiveness between a conductive layer and a ground electrode for connection to the conductive layer in some cases.

The present disclosure has been made in view of such circumstances, and according to an embodiment of the present invention, there is provided a manufacturing method of an electronic device having excellent adhesiveness between a conductive layer and a ground electrode.

The present disclosure includes the following aspects.

<1> A manufacturing method of an electronic device, the method comprising: a step of preparing an electronic substrate including a wiring board, an electronic component disposed on the wiring board, and a ground electrode having an organic acid on a surface thereof; and a step of applying an ink for forming a conductive layer onto at least a part of the ground electrode having the organic acid on the surface thereof, to form a conductive layer that is a cured film of the ink for forming a conductive layer, in which the organic acid includes at least one compound selected from the group consisting of a monocarboxylic acid having a molecular weight of less than 350 and a dicarboxylic acid having a molecular weight of less than 350.

<2>
The manufacturing method of an electronic device according to <1>, in which the dicarboxylic acid is succinic acid, glutaric acid, or adipic acid.

<3>
The manufacturing method of an electronic device according to <1> or <2>, in which the monocarboxylic acid is abietic acid.

<4>
The manufacturing method of an electronic device according to any one of <1> to <3>, in which the organic acid includes at least one compound selected from the group consisting of succinic acid, glutaric acid, and abietic acid.

<5>
The manufacturing method of an electronic device according to any one of <1> to <4>, further comprising: a step of forming an insulating layer that is in contact with the ground electrode and covers the electronic component, in which, in the step of forming the conductive layer, the ink for forming a conductive layer is applied onto the insulating layer and at least a part of the ground electrode having the organic acid on the surface thereof.

<6>
The manufacturing method of an electronic device according to <5>, in which the step of forming an insulating layer is a step of applying an ink for forming an insulating layer and irradiating the ink for forming an insulating layer with an active energy ray to form an insulating layer that is a cured film of the ink for forming an insulating layer.

<7>
The manufacturing method of an electronic device according to <5> or <6>, in which the insulating layer contains an acrylic resin or an epoxy resin.

<8>
The manufacturing method of an electronic device according to any one of <1> to <7>, in which the ink for forming a conductive layer contains a metal complex or a metal salt.

According to an embodiment of the present invention, there is provided a manufacturing method of an electronic device having excellent adhesiveness between a conductive layer and a ground electrode.

DESCRIPTION OF THE PREFERRED EMBODIMENTS

Figure 1:
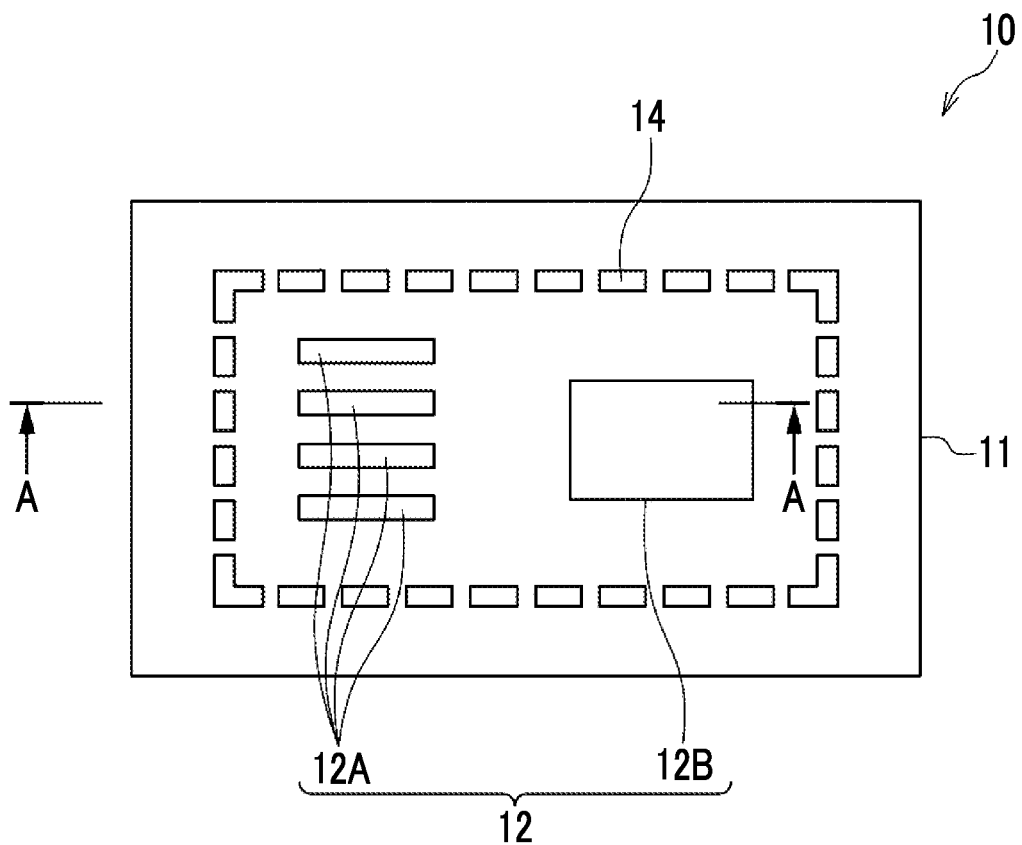
FIG. 1 is a schematic plan view of an electronic substrate prepared in a preparation step.

Hereinafter, a manufacturing method of an electronic device according to the present disclosure will be described in detail.

In the present specification, a numerical range indicated using "to" means a range including numerical values described before and after "to" as a minimum value and a maximum value, respectively.

In a numerical range described in a stepwise manner in the present specification, an upper limit or a lower limit described in a certain numerical range may be replaced with an upper limit or a lower limit in another numerical range described in a stepwise manner. In addition, in a numerical range described in the present specification, an upper limit or a lower limit described in a certain numerical range may be replaced with a value described in Examples.

In the present specification, in a case in which a plurality of substances corresponding to respective components in a composition are present, the amount of the respective components in the composition means the total amount of the plurality of substances present in the composition unless otherwise specified.

In the present specification, a combination of two or more preferred aspects is a more preferred aspect.

In the present specification, the meaning of the term "step" includes not only an independent step but also a step whose intended purpose is achieved even in a case in which the step is not clearly distinguished from other steps.

In the present specification, the term "image" means general films, and the term "image recording" means formation of an image (that is, a film). The concept of "image" in the present specification also includes a solid image.

[Manufacturing Method of Electronic Device]

A manufacturing method of an electronic device according to the present disclosure includes: a step of preparing an electronic substrate including a wiring board, an electronic component disposed on the wiring board, and a ground electrode having an organic acid on a surface thereof (hereinafter, also referred to as a "preparation step"); and a step of applying an ink for forming a conductive layer onto at least a part of the ground electrode having the organic acid on the surface thereof, to form a conductive layer that is a cured film of the ink for forming a conductive layer (hereinafter, also referred to as a "conductive layer forming step"). The organic acid includes at least one compound selected from the group consisting of a monocarboxylic acid having a molecular weight of less than 350 and a dicarboxylic acid having a molecular weight of less than 350.

In the related art, in a case in which an electronic device is exposed to a high temperature environment, peeling may occur at an interface between a ground electrode and a conductive layer. This is considered to be due not only to a difference between a metal constituting the ground electrode and a metal constituting the conductive layer but also to a decrease in adhesiveness due to an oxide film present on a surface of the ground electrode.

With respect to this, in the manufacturing method of an electronic device according to the present disclosure, the ink for forming a conductive layer is applied onto at least a part of the ground electrode having the organic acid on the surface thereof. Since the organic acid is present on the ground electrode, oxidation of the ground electrode surface is suppressed, and thus the adhesiveness between the ground electrode and the conductive layer is improved.

JP2017-179361A has no description focusing on the organic acid on the ground electrode surface.

Hereinafter, an example of the manufacturing method of an electronic device according to an embodiment of the present disclosure will be described with reference to the drawings. Note that the manufacturing method of an electronic device according to the embodiment of the present disclosure is not limited to the following example.

In the following description, substantially the same elements (for example, components or parts) may be designated by the same reference numerals, and redundant description thereof may be omitted.

<Preparation Step>

Figure 2:
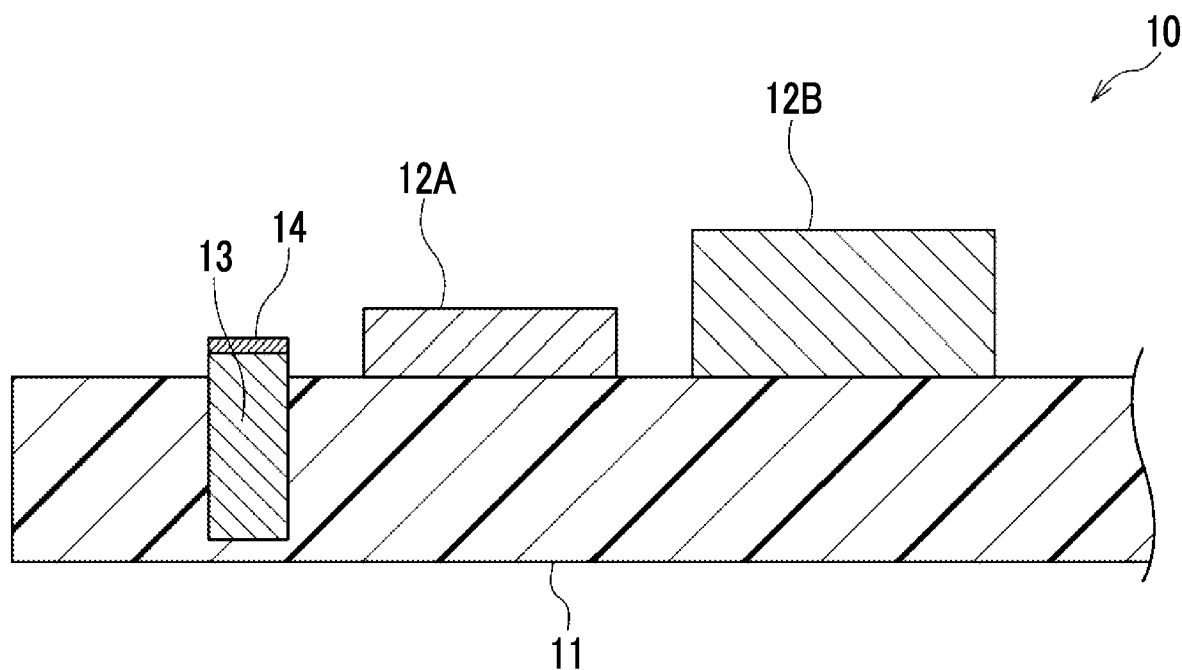
FIG. 2 is a cross-sectional view taken along the line A-A of FIG. 1.

FIG. 1 is a schematic plan view of an electronic substrate prepared in the preparation step. FIG. 2 is a cross-sectional view taken along the line A-A of FIG. 1.

As shown in FIGS. 1 and 2, in the preparation step, an electronic substrate 10 comprising a wiring board 11, electronic components 12 (12A and 12B) disposed on the wiring board 11, and a ground electrode 13 having an organic acid 14 on a surface thereof is prepared.

The preparation step may be a step of simply preparing the electronic substrate 10 manufactured in advance, or may be a step of manufacturing the electronic substrate 10.

As a manufacturing method of the electronic substrate 10, a known manufacturing method can be referred to.

Examples of the electronic substrate 10 include a flexible print substrate, a rigid print substrate, and a rigid flexible substrate.

The wiring board refers to one with a wiring on the board and/or inside the board.

Examples of the substrate constituting the wiring board 11 include a glass epoxy substrate, a ceramic substrate, a polyimide substrate, and a polyethylene terephthalate substrate. The substrate may have a monolayer structure or a multilayer structure.

The wiring (not shown) provided on the wiring board 11 is preferably a copper wiring. For example, one end of the wiring is connected to an external power supply, and the other end is connected to a terminal of the electronic component 12.

Examples of the electronic component 12 include a semiconductor chip, a capacitor, and a transistor. The number of the electronic components 12 disposed on the wiring board 11 is not particularly limited. FIG. 1 shows an example in which four electronic components 12A and one electronic component 12B are disposed.

The ground electrode 13 is an electrode to which a ground (GND) potential is applied. In FIG. 1, the ground electrode 13 surrounds the electronic components 12A and 12B and is formed in a discontinuous frame shape in plan view, but a position and a shape of the ground electrode are not limited thereto. For example, the ground electrode may be formed in a continuous frame shape in plan view, or may be formed between the electronic component 12A and the electronic component 12B.

In addition, in FIG. 1, the ground electrode 13 is formed such that a part of the ground electrode 13 in a thickness direction is embedded in the wiring board 11, but the ground electrode in the present disclosure is not limited to this example. For example, the ground electrode may be formed on a surface of the wiring board 11 instead of being embedded in the wiring board 11. In addition, the ground electrode may be formed as a pattern that penetrates the wiring board 11.

In the electronic substrate 10 prepared in the preparation step, the organic acid 14 is present on a surface of the ground electrode 13. On the surface of the ground electrode 13, only the organic acid 14 may be disposed, or the organic acid 14 and other components may be disposed. In FIGS. 1 and 2, the organic acid 14 is disposed so as to cover the entire surface of the ground electrode 13, but it is preferable that the organic acid 14 is scattered on the surface of the ground electrode 13.

The preparation step may be a step of obtaining a substrate comprising a ground electrode having no organic acid on a surface thereof and applying an organic acid to a surface of the ground electrode.

A method of disposing the organic acid on the surface of the ground electrode is not particularly limited, and examples thereof include a coating method. The organic acid can be disposed on the surface of the ground electrode by applying a composition containing an organic acid onto the ground electrode and drying the composition. The method of drying the applied composition containing an organic acid is not particularly limited, and may be natural drying or may be carried out using a heating device. Examples of the heating device include an oven. A heating temperature is, for example, 20° ° C. to 120° C., and a heating time is, for example, 1 minute to 1 hour.

The organic acid includes at least one compound (hereinafter, also referred to as "specific carboxylic acid") selected from the group consisting of a monocarboxylic acid having a molecular weight of less than 350 and a dicarboxylic acid having a molecular weight of less than 350.

Since the organic acid is present on the surface of the ground electrode, the oxide film is not formed on the surface of the ground electrode, and thus the adhesiveness between the ground electrode and the conductive layer is improved. In addition, since the specific carboxylic acid has a molecular weight of less than 350, a boiling point tends to be low. Therefore, in the conductive layer forming step described below, in a case in which the ink for forming a conductive layer is cured, the amount of the specific carboxylic acid can be reduced, so that the adhesiveness between the ground electrode and the conductive layer is excellent. Therefore, a component other than the organic acid may be present on the surface of the ground electrode, but it is preferable that the content is only a compound having a molecular weight of less than 350.

Furthermore, in a case in which the specific carboxylic acid reacts with a component (for example, an amine) contained in the ink for forming a conductive layer, viscosity of the ink for forming a conductive layer is increased. In a case in which the ink for forming a conductive layer thickens on the ground electrode, it is difficult for the ink for forming a conductive layer to spread, and thus the conductive layer is formed with high accuracy.

The molecular weight of the compound can be calculated from the type and number of elements constituting the compound.

The monocarboxylic acid having a molecular weight of less than 350 is preferably rosin acid contained in rosin. Examples of the monocarboxylic acid having a molecular weight of less than 350 include pimaric acid, palustric acid, isopimaric acid, abietic acid, dehydroabietic acid, neoabietic acid, and lignoceric acid. Among these, from the viewpoint of further improving the adhesiveness between the ground electrode and the conductive layer, the monocarboxylic acid having a molecular weight of less than 350 is preferably abietic acid.

The dicarboxylic acid having a molecular weight of less than 350 is preferably a saturated aliphatic dicarboxylic acid. Examples of the saturated aliphatic dicarboxylic acid include oxalic acid, malonic acid, succinic acid, glutaric acid, adipic acid, pimelic acid, suberic acid, azelaic acid, and sebacic acid. Among these, from the viewpoint of further improving the adhesiveness between the ground electrode and the conductive layer, the dicarboxylic acid having a molecular weight of less than 350 is preferably succinic acid, glutaric acid, or adipic acid.

Among these, the organic acid includes at least one compound selected from the group consisting of succinic acid, glutaric acid, and abietic acid.

In addition, from the viewpoint of improving the positional accuracy of the conductive layer, the organic acid more preferably includes a dicarboxylic acid having a molecular weight of less than 350 in order to obtain a thickening effect of the ink for forming a conductive layer.

<Insulating Layer Forming Step>

It is preferable that the manufacturing method of an electronic device further includes a step of forming an insulating layer that is in contact with the ground electrode and covers the electronic component (hereinafter, also referred to as an "insulating layer forming step"). In a case in which the insulating layer forming step is included, in the conductive layer forming step described below, the ink for forming a conductive layer is applied onto the insulating layer and at least a part of the ground electrode having an organic acid on the surface thereof.

Hereinafter, an example of the insulating layer forming step will be described with reference to FIGS. 3A and 3B.

Figure 3A:
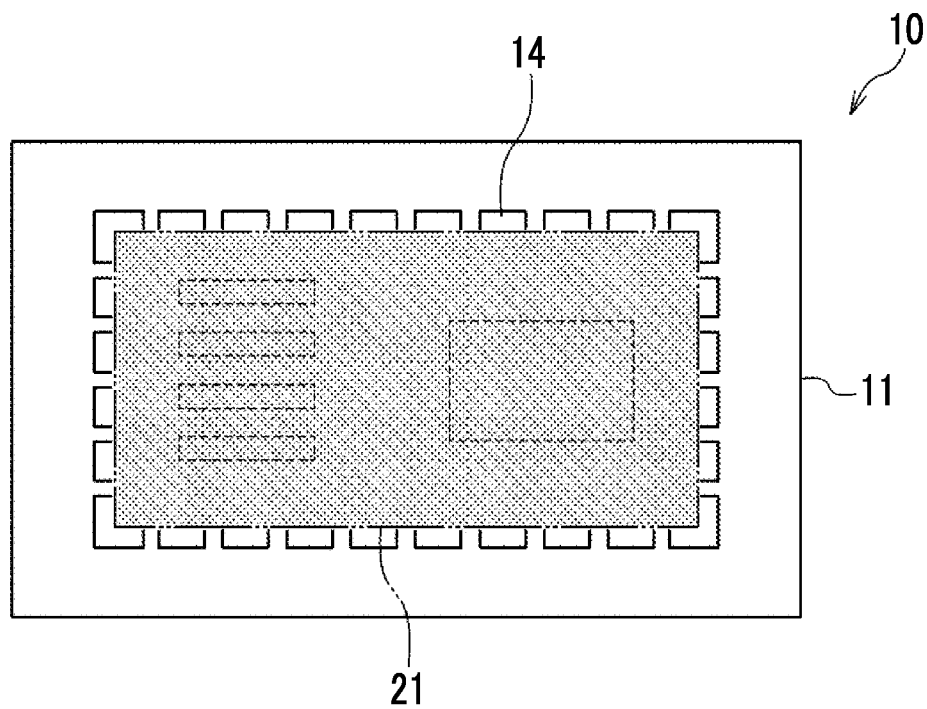
FIG. 3A is a diagram showing an example of an application region of an ink for forming an insulating layer.
Figure 3B:
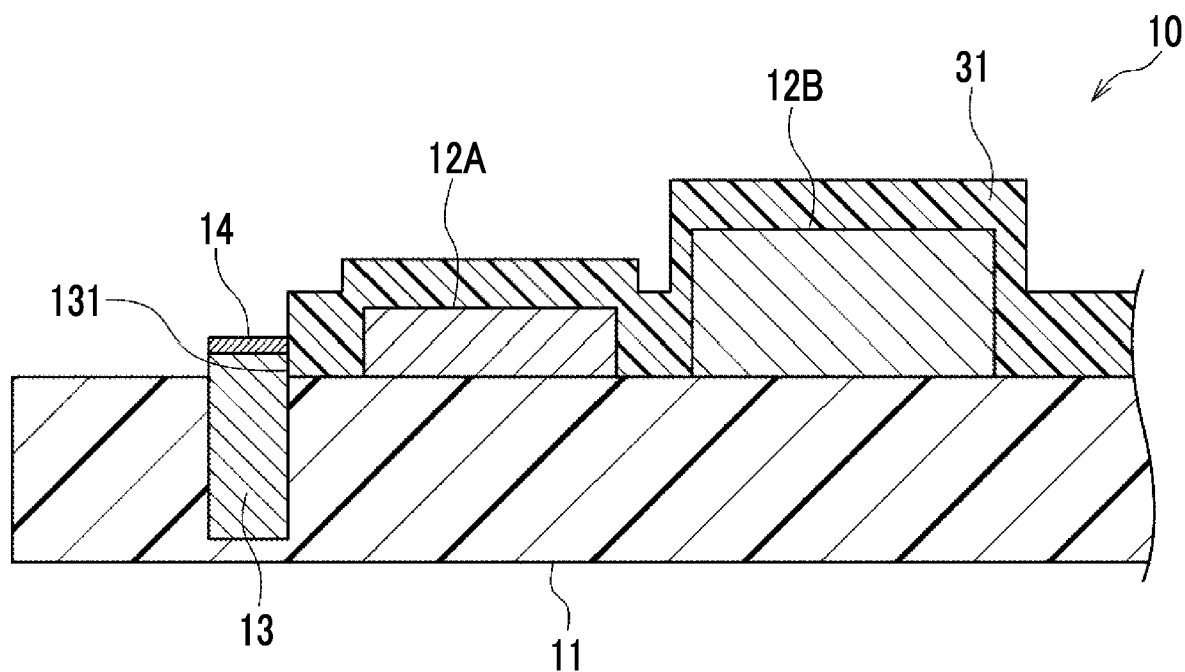
FIG. 3B is a diagram showing a state where an insulating layer is formed in the cross-sectional view taken along the line A-A in FIG. 1.

FIG. 3A is a diagram showing an example of an application region of an ink for forming an insulating layer. FIG. 3B is a diagram showing a state where the insulating layer is formed in the cross-sectional view taken along the line A-A in FIG. 1.

It is preferable that the insulating layer forming step is a step of applying an ink for forming an insulating layer and irradiating the ink for forming an insulating layer with an active energy ray to form an insulating layer that is a cured film of the ink for forming an insulating layer. By performing irradiation with the active energy ray after the application of the ink for forming an insulating layer, as shown in FIG. 3B, an insulating layer 31 that covers the electronic components 12A and 12B is formed.

It is preferable that the step of applying the ink for forming an insulating layer and irradiating the ink for forming an insulating layer with the active energy ray is repeated. By repeating the step, a thickness of the cured film of the ink for forming an insulating layer can be increased.

A region where the ink for forming an insulating layer is applied (an application region of the ink for forming an insulating layer) is set such that the insulating layer is in contact with the ground electrode. In FIG. 3A, an application region 21 of the ink for forming an insulating layer is the same as a region that does not include the ground electrode 13 and is surrounded by the ground electrode 13 (hereinafter, also referred to as a "ground region"). As a result, as shown in FIG. 3B, a wall surface 131 of the ground electrode 13 on the ground region side is in contact with the insulating layer 31.

In a case in which the insulating layer is formed to be in contact with the ground electrode, in the conductive layer forming step described below, the ink for forming a conductive layer can be applied onto the insulating layer and at least a part of the ground electrode having an organic acid on the surface thereof. For example, in a case in which the insulating layer and the ground electrode are not in contact with each other, the ink for forming a conductive layer may also be applied onto the wiring board. In the conductive layer forming step, it is preferable that the ink for forming a conductive layer is not applied onto the wiring board from the viewpoint of improving the adhesiveness between the ground electrode and the conductive layer.

In this example, the region 21 is set as the application region of the ink for forming an insulating layer, but the present disclosure is not limited to this example.

For example, the position and the shape (planar shape and height) of the ground electrode 13 and the electronic component 12 disposed on the wiring board 11 are read in advance, and the application region of the ink for forming an insulating layer and the number of times of the application of the ink for forming an insulating layer are preferably set based on the read data.

(Insulating Layer)

The insulating layer is a cured substance of the ink for forming an insulating layer. From the viewpoint of curing properties and mechanical strength, the insulating layer preferably contains a polymer of a radically polymerizable monomer or a polymer or a crosslinked substance of a cyclic ether compound, and more preferably includes an acrylic resin or an epoxy resin.

A thickness of the insulating layer is preferably 1 μm to 5000 μm, and more preferably 50 μm to 2000 μm.

(Ink for Forming Insulating Layer)

In the present disclosure, the ink for forming an insulating layer means an ink for forming a layer having insulating properties. The insulating properties mean properties of having a volume resistivity of $10^{10}$ Ωcm or more.

The ink for forming an insulating layer is preferably an active energy ray curable-type ink.

The ink for forming an insulating layer preferably contains a polymerizable monomer and a polymerization initiator.

—Polymerizable Monomer—

The polymerizable monomer refers to a monomer having at least one polymerizable group in one molecule. In the present disclosure, the monomer refers to a compound having a molecular weight of 1000 or less. The molecular weight can be calculated from the type and number of atoms constituting the compound.

The polymerizable monomer may be a monofunctional polymerizable monomer having one polymerizable group or a polyfunctional polymerizable monomer having two or more polymerizable groups.

The polymerizable group in the polymerizable monomer may be a cationically polymerizable group or a radically polymerizable group. In addition, from the viewpoint of curing properties, the radically polymerizable group is preferably an ethylenically unsaturated group. From the viewpoint of curing properties, the cationically polymerizable group is preferably a group containing at least one of an oxirane ring or an oxetane ring.

From the viewpoint of the curing properties, the radically polymerizable monomer is preferably a monofunctional ethylenically unsaturated monomer.

Examples of the monofunctional ethylenically unsaturated monomer include monofunctional (meth)acrylate, monofunctional (meth)acrylamide, a monofunctional aromatic vinyl compound, monofunctional vinyl ether, and a monofunctional N-vinyl compound.

Examples of the monofunctional (meth)acrylate include methyl (meth)acrylate, ethyl (meth)acrylate, propyl (meth)acrylate, n-butyl (meth)acrylate, hexyl (meth)acrylate, 2-ethylhexyl (meth)acrylate, tert-octyl (meth)acrylate, isoamyl (meth)acrylate, decyl (meth)acrylate, isodecyl (meth)acrylate, lauryl (meth)acrylate, stearyl (meth)acrylate, isostearyl (meth)acrylate, cyclohexyl (meth)acrylate, 4-n-butylcyclohexyl (meth)acrylate, 4-tert-butylcyclohexyl (meth)acrylate, bornyl (meth)acrylate, isobornyl (meth)acrylate, 2-ethylhexyldiglycol (meth)acrylate, butoxyethyl (meth)acrylate, 2-chloroethyl (meth)acrylate, 4-bromobutyl (meth)acrylate, cyanoethyl (meth)acrylate, benzyl (meth)acrylate, butoxymethyl (meth)acrylate, 3-methoxybutyl (meth)acrylate, 2-(2-methoxyethoxy)ethyl (meth)acrylate, 2-(2-butoxyethoxy)ethyl (meth)acrylate, 2,2,2-tetrafluoroethyl (meth)acrylate, 1H, 1H,2H,2H-perfluorodecyl (meth)acrylate, 4-butylphenyl (meth)acrylate, phenyl (meth)acrylate, 2,4,5-tetramethylphenyl (meth)acrylate, 4-chlorophenyl (meth)acrylate, 2-phenoxymethyl (meth)acrylate, 2-phenoxyethyl (meth)acrylate, glycidyl (meth)acrylate, glycidyloxybutyl (meth)acrylate, glycidyloxyethyl (meth)acrylate, glycidyloxypropyl (meth)acrylate, tetrahydrofurfuryl (meth)acrylate, 2-hydroxyethyl (meth)acrylate, 3-hydroxypropyl (meth)acrylate, 2-hydroxypropyl (meth)acrylate, 2-hydroxybutyl (meth)acrylate, 3-hydroxybutyl (meth)acrylate, 4-hydroxybutyl (meth)acrylate, cyclic trimethylolpropane formal (meth)acrylate, phenylglycidyl ether (meth)acrylate, dimethylaminoethyl (meth)acrylate, diethylaminoethyl (meth)acrylate, dimethylaminopropyl (meth)acrylate, diethylaminopropyl (meth)acrylate, trimethoxysilylpropyl (meth)acrylate, trimethylsilylpropyl (meth)acrylate, polyethylene oxide monomethyl ether (meth)acrylate, polyethylene oxide (meth)acrylate, polyethylene oxide monoalkyl ether (meth)acrylate, dipropylene glycol (meth)acrylate, polypropylene oxide monoalkyl ether (meth)acrylate, 2-methacryloyloxyethyl succinate, 2-methacryloyloxyhexahydrophthalic acid, 2-methacryloyloxyethyl-2-hydroxypropyl phthalate, ethoxydiethylene glycol (meth)acrylate, butoxydiethylene glycol (meth)acrylate, trifluoroethyl (meth)acrylate, perfluorooctylethyl (meth)acrylate, 2-hydroxy-3-phenoxypropyl (meth)acrylate, ethylene oxide (EO)-modified phenol (meth)acrylate, EO-modified cresol (meth)acrylate, EO-modified nonylphenol (meth)acrylate, propylene oxide (PO)-modified nonylphenol (meth)acrylate, EO-modified-2-ethylhexyl (meth)acrylate, dicyclopentenyl (meth)acrylate, dicyclopentenyloxyethyl (meth)acrylate, dicyclopentanyl (meth)acrylate, (3-ethyl-3-oxetanylmethyl) (meth)acrylate, phenoxyethylene glycol (meth)acrylate, 2-carboxyethyl (meth)acrylate, and 2-(meth)acryloyloxyethyl succinate.

Among these, from the viewpoint of improving heat resistance, the monofunctional (meth)acrylate is preferably a monofunctional (meth)acrylate having an aromatic ring or an aliphatic ring, and is more preferably isobornyl (meth)acrylate, 4-tert-butylcyclohexyl (meth)acrylate, dicyclopentenyl (meth)acrylate, or dicyclopentanyl (meth)acrylate.

Examples of the monofunctional (meth)acrylamide include (meth)acrylamide, N-methyl (meth)acrylamide, N-ethyl (meth)acrylamide, N-propyl (meth)acrylamide, N-n-butyl (meth)acrylamide, N-t-butyl (meth)acrylamide, N-butoxymethyl (meth)acrylamide, N-isopropyl (meth)acrylamide, N-methylol (meth)acrylamide, N,N-dimethyl (meth)acrylamide, N,N-diethyl (meth)acrylamide, and (meth)acryloylmorpholine.

Examples of the monofunctional aromatic vinyl compound include styrene, dimethylstyrene, trimethylstyrene, isopropylstyrene, chloromethylstyrene, methoxystyrene, acetoxystyrene, chlorostyrene, dichlorostyrene, bromostyrene, vinyl benzoic acid methyl ester, 3-methylstyrene, 4-methylstyrene, 3-ethylstyrene, 4-ethylstyrene, 3-propylstyrene, 4-propylstyrene, 3-butylstyrene, 4-butylstyrene, 3-hexylstyrene, 4-hexylstyrene, 3-octylstyrene, 4-octylstyrene, 3-(2-ethylhexyl)styrene, 4-(2-ethylhexyl)styrene, allyl styrene, isopropenyl styrene, butenyl styrene, octenyl styrene, 4-t-butoxycarbonyl styrene, and 4-t-butoxystyrene.

Examples of the monofunctional vinyl ether include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Examples of the monofunctional N-vinyl compound include N-vinyl-ε-caprolactam and N-vinylpyrrolidone.

The polyfunctional polymerizable monomer is not particularly limited as long as it is a monomer having two or more polymerizable groups. From the viewpoint of curing properties, the polyfunctional polymerizable monomer is preferably a polyfunctional radically polymerizable monomer, and more preferably a polyfunctional ethylenically unsaturated monomer.

Examples of the polyfunctional ethylenically unsaturated monomer include a polyfunctional (meth)acrylate compound and a polyfunctional vinyl ether.

Examples of the polyfunctional (meth)acrylate include ethylene glycol di(meth)acrylate, diethylene glycol di(meth)acrylate, triethylene glycol di(meth)acrylate, polyethylene glycol di(meth)acrylate, propylene glycol di(meth)acrylate, dipropylene glycol di(meth)acrylate, tripropylene glycol di(meth)acrylate, polypropylene glycol di(meth)acrylate, butylene glycol di(meth)acrylate, tetraethylene glycol di(meth)acrylate, neopentyl glycol di(meth)acrylate, 3-methyl-1,5-pentanediol di(meth)acrylate, 1,6-hexanediol di(meth)acrylate, heptanediol di(meth)acrylate, EO-modified neopentyl glycol di(meth)acrylate, PO-modified neopentyl glycol di(meth)acrylate, EO-modified hexanediol di(meth)acrylate, PO-modified hexanediol di(meth)acrylate, octanediol di(meth)acrylate, nonanediol di(meth)acrylate, decanediol di(meth)acrylate, dodecanediol di(meth)acrylate, glycerin di(meth)acrylate, pentaerythritol di(meth)acrylate, ethylene glycol diglycidyl ether di(meth)acrylate, diethylene glycol diglycidyl ether di(meth)acrylate, tricyclodecanedimethanol di(meth)acrylate, trimethylolethane tri(meth)acrylate, trimethylolpropane tri(meth)acrylate, trimethylolpropane EO-added tri(meth)acrylate, pentaerythritol tri(meth)acrylate, pentaerythritol tetra(meth)acrylate, dipentaerythritol tetra(meth)acrylate, dipentaerythritol penta(meth)acrylate, dipentaerythritol hexa(meth)acrylate, tri(meth)acryloyloxyethoxytrimethylolpropane, glycerin polyglycidyl ether poly(meth)acrylate, and tris(2-acryloyloxyethyl) isocyanurate.

Examples of the polyfunctional vinyl ether include 1,4-butanediol divinyl ether, ethylene glycol divinyl ether, diethylene glycol divinyl ether, triethylene glycol divinyl ether, polyethylene glycol divinyl ether, propylene glycol divinyl ether, butylene glycol divinyl ether, hexanediol divinyl ether, 1,4-cyclohexanedimethanol divinyl ether, bisphenol A alkylene oxide divinyl ether, bisphenol F alkylene oxide divinyl ether, trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, EO-added trimethylolpropane trivinyl ether, PO-added trimethylolpropane trivinyl ether, EO-added ditrimethylolpropane tetravinyl ether, PO-added ditrimethylolpropane tetravinyl ether, EO-added pentaerythritol tetravinyl ether, PO-added pentaerythritol tetravinyl ether, EO-added dipentaerythritol hexavinyl ether, and PO-added dipentaerythritol hexavinyl ether.

Among these, from the viewpoint of curing properties, the polyfunctional polymerizable monomer is preferably a monomer having 3 to 11 carbon atoms in a portion other than a (meth)acryloyl group. As the monomer having 3 to 11 carbon atoms in a portion other than a (meth)acryloyl group, specifically, 1,6-hexanediol di(meth)acrylate, dipropylene glycol di(meth)acrylate, PO-modified neopentyl glycol di(meth)acrylate, 1,4-butanediol di(meth)acrylate, 3-methyl-1,5-pentanediol di(meth)acrylate, polyethylene glycol di(meth)acrylate (EO chain n=4), or 1,10-decanediol di(meth)acrylate is more preferable.

As the cationically polymerizable monomer, a known cationically polymerizable monomer such as a compound (also referred to as an "oxirane compound" or an "epoxy compound") having an oxirane ring (also referred to as an "epoxy ring"), a compound (also referred to as an "oxetane compound") having an oxetane ring, and a vinyl ether compound can be used without particular limitation, from the viewpoint of curing properties.

The cationically polymerizable monomer is not particularly limited as long as it is a compound that initiates a polymerization reaction with cationic polymerization initiating species generated from a photocationic polymerization initiator described below and is cured, and various known cationically polymerizable monomers known as a photocationically polymerizable monomer can be used.

Examples of the cationically polymerizable monomer include an epoxy compound, a vinyl ether compound, and an oxetane compound, which are disclosed in JP1994-9714A (JP-H6-9714A), JP2001-31892A, JP2001-40068A, JP2001-55507A, JP2001-310938A, JP2001-310937A, and JP2001-220526A.

In addition, as the cationically polymerizable monomer, for example, a cationic polymerization-based photocurable resin is known, and recently, a photocationic polymerization-based photocurable resin sensitized in a visible light wavelength of 400 nm or more has been disclosed, for example, in JP1994-43633A (JP-H6-43633A) and JP1996-324137A (JP-H8-324137A).

Examples of the epoxy compound include aromatic epoxides, alicyclic epoxides, and aliphatic epoxides.

Examples of the aromatic epoxide include di or polyglycidyl ether produced by reacting a polyhydric phenol having at least one aromatic nucleus or an alkylene oxide adduct thereof with epichlorohydrin.

Examples of the aromatic epoxide include di or polyglycidyl ethers of bisphenol A or an alkylene oxide adduct of bisphenol A, di or polyglycidyl ethers of hydrogenated bisphenol A or an alkylene oxide adduct of hydrogenated bisphenol A, and novolak-type epoxy resin. Here, examples of the alkylene oxide include ethylene oxide and propylene oxide.

Examples of the alicyclic epoxide preferably include cyclohexene oxide or cyclopentene oxide-containing compounds, which are obtained by epoxidizing a compound having at least one cycloalkane ring such as a cyclohexene ring and a cyclopentene ring with an appropriate oxidizing agent such as hydrogen peroxide and peroxy acid.

Examples of the aliphatic epoxide include aliphatic polyhydric alcohols or di- or polyglycidyl ethers of an alkylene oxide adduct of polyhydric alcohol, and typical examples thereof include diglycidyl ethers of alkylene glycol, such as diglycidyl ether of ethylene glycol, diglycidyl ether of propylene glycol, and diglycidyl ether of 1,6-hexanediol; polyglycidyl ethers of polyhydric alcohol, such as di- or triglycidyl ether of glycerin or an alkylene oxide adduct of glycerin; and diglycidyl ethers of polyalkylene glycol represented by diglycidyl ether of polyethylene glycol or an alkylene oxide adduct of polyethylene glycol, and diglycidyl ether of polypropylene glycol or an alkylene oxide adduct of polypropylene glycol.

Here, examples of the alkylene oxide include ethylene oxide and propylene oxide.

Hereinafter, the monofunctional and polyfunctional epoxy compounds will be described in detail.

Examples of the monofunctional epoxy compound include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monoxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, 3-vinylcyclohexene oxide, and 4-vinylcyclohexene oxide.

Examples of the polyfunctional epoxy compound include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)cyclohexane-bis(3,4-epoxy-6-meta-dioxane, bis(3,4-epoxycyclohexylmethyl)adipate, 3,4-epoxy-6-methylcyclohexyl-3',4'-epoxy-6'-methylcyclohexylmethyl) adipate, methylcyclohexanecarboxylate, methylenebis(3,4-epoxycyclohexane), dicyclopentadiene diepoxide, ethylene glycol di(3,4-epoxycyclohexylmethyl) ether, ethylene bis(3,4-epoxycyclohexanecarboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,13-tetradecadiene dioxide, limonene dioxide, 1,2,7,8-diepoxyoctane, and 1,2,5,6-diepoxycyclooctane.

Among the epoxy compounds, an aromatic epoxide and an alicyclic epoxide are preferable from the viewpoint of an excellent curing rate, and an alicyclic epoxide is particularly preferable.

The oxetane compound refers to a compound having at least one oxetane ring, and any known oxetane compound as disclosed in JP2001-220526A, JP2001-310937A, or JP2003-341217A can be selected and used.

As the compound having an oxetane ring, a compound having 1 to 4 oxetane rings in a structure thereof is preferable. By using such a compound, it is easy to maintain the viscosity of the ink composition within a favorable range of handleability. In addition, high adhesiveness of the cured ink composition to a recording medium can be obtained.

Examples of the compound having 1 or 2 oxetane rings in a molecule include compounds represented by Formulae (1) to (3).

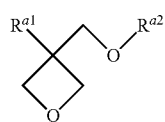

(1)

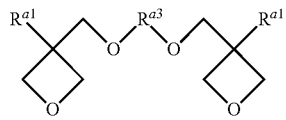

(2)

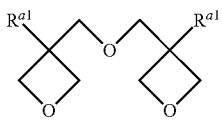

(3)

In Formulae (1) to (3), $R^{a1}$ represents a hydrogen atom, an alkyl group having 1 to 6 carbon atoms, a fluoroalkyl group having 1 to 6 carbon atoms, an allyl group, an aryl group, a furyl group, or a thienyl group.

In a case in which two $R^{a1}$'s exist in a molecule, they may be the same as or different from each other.

Examples of the alkyl group include a methyl group, an ethyl group, a propyl group, and a butyl group, and preferred examples of the fluoroalkyl group include one of the alkyl groups of which one hydrogen is substituted with a fluorine atom.

$R^{a2}$ represents a hydrogen atom, an alkyl group having 1 to 6 carbon atoms, an alkenyl group having 2 to 6 carbon atoms, a group having an aromatic ring, an alkylcarbonyl group having 2 to 6 carbon atoms, an alkoxycarbonyl group having 2 to 6 carbon atoms, and an N-alkylcarbamoyl group having 2 to 6 carbon atoms. Examples of the alkyl group include a methyl group, an ethyl group, a propyl group, and a butyl group. Examples of the alkenyl group include a 1-propenyl group, a 2-propenyl group, a 2-methyl-1-propenyl group, a 2-methyl-2-propenyl group, a 1-butenyl group, a 2-butenyl group, and a 3-butenyl group. Examples of the group having an aromatic ring include a phenyl group, a benzyl group, a fluorobenzyl group, a methoxybenzyl group, and a phenoxyethyl group. Examples of the alkylcarbonyl group include an ethylcarbonyl group, a propylcarbonyl group, and a butylcarbonyl group. Examples of the alkoxycarbonyl group include an ethoxycarbonyl group, a propoxycarbonyl group, and a butoxycarbonyl group. Examples of the N-alkylcarbamoyl group include an ethylcarbamoyl group, a propylcarbamoyl group, a butylcarbamoyl group, and a pentylcarbamoyl group.

$R^{a2}$ may have a substituent, and examples of the substituent include an alkyl group having 1 to 6 carbon atoms and a fluorine atom.

$R^{a3}$ represents a linear or branched alkylene group, a linear or branched poly(alkyleneoxy) group, a linear or branched unsaturated hydrocarbon group, a carbonyl group or a carbonyl group-containing alkylene group, a carboxy group-containing alkylene group, a carbamoyl group-containing alkylene group, or a group shown below. Examples of the alkylene group include an ethylene group, a propylene group, and a butylene group. Examples of the poly(alkyleneoxy) group include a poly(ethyleneoxy) group and a poly(propyleneoxy) group. Examples of the unsaturated hydrocarbon group include a propenylene group, a methylpropenylene group, and a butenylene group.

Examples of the compound represented by Formula (1) include 3-ethyl-3-hydroxymethyloxetane (OXT-101: manufactured by Toagosei Co., Ltd.), 3-ethyl-3-(2-ethylhexyloxymethyl)oxetane (OXT-212: manufactured by Toagosei Co., Ltd.), and 3-ethyl-3-phenoxymethyloxetane (OXT-211: manufactured by Toagosei Co., Ltd.).

Examples of the compound represented by Formula (2) include 1,4-bis[(3-ethyl-3-oxetanylmethoxy)methyl]benzene (OXT-121: manufactured by Toagosei Co., Ltd.).

Examples of the compound represented by Formula (3) include bis(3-ethyl-3-oxetanylmethyl) ether (OXT-221: manufactured by Toagosei Co., Ltd.).

For the compound having an oxetane ring, paragraphs 0021 to 0084 of JP2003-341217A, JP2004-91556A, and paragraphs 0022 to 0058 of JP2004-91556A may be referred to.

Examples of a preferred cationically polymerizable monomer are listed below.

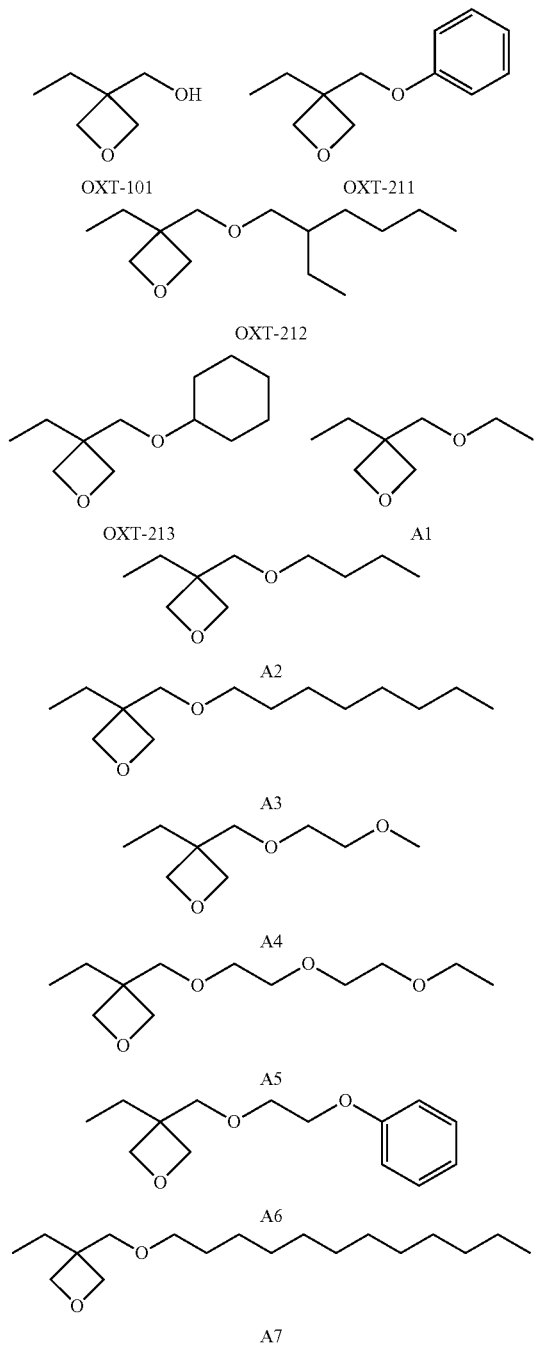

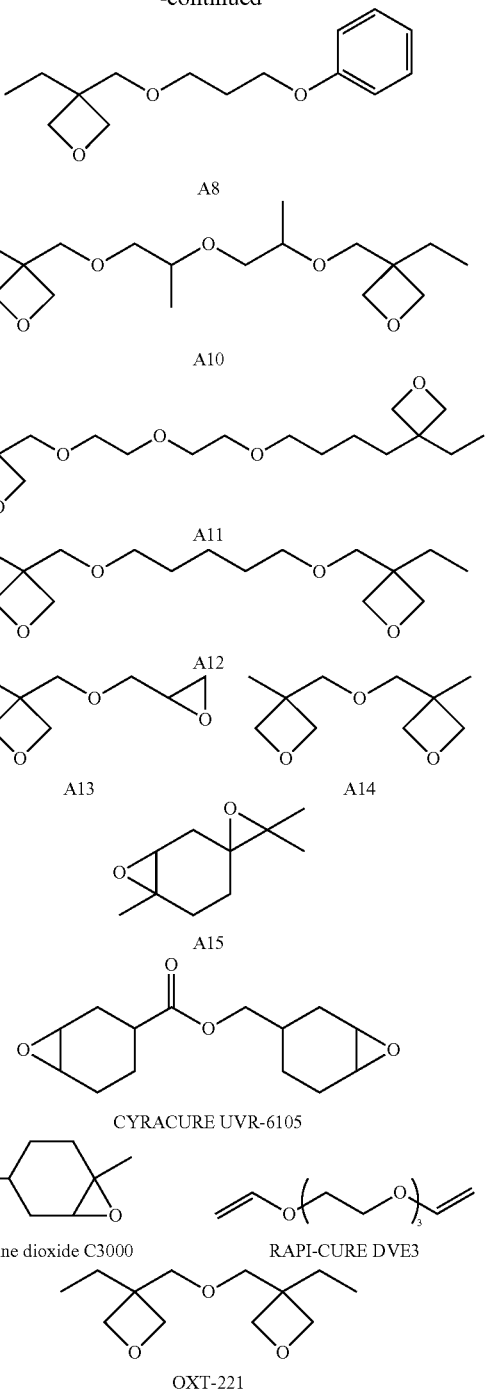

Examples of the cationically polymerizable monomer also include a vinyl ether compound. Specific examples of the vinyl ether compound are as described above.

As the vinyl ether compound, from the viewpoint of curing properties, adhesiveness to the recording medium, surface hardness of the formed image, and the like, a divinyl ether compound or a trivinyl ether compound is preferable, and a divinyl ether compound is particularly preferable.

The content of the polymerizable monomer is preferably 10% by mass to 98% by mass, and more preferably 50% by mass to 98% by mass, with respect to the total amount of the ink for forming an insulating layer.

—Polymerization Initiator—

The ink for forming an ink for forming an insulating layer contains a polymerization initiator for the purpose of curing the polymerizable monomer. As the polymerization initiator, a suitable polymerization initiator can be selected from a radical polymerization initiator or a cationic polymerization initiator depending on a type of the polymerizable monomers. Examples of the polymerization initiator include an oxime compound, an alkylphenone compound, an acylphosphine compound, an aromatic onium salt compound, an organic peroxide, a thio compound, a hexaarylbisimidazole compound, a borate compound, an azinium compound, a titanocene compound, an active ester compound, a carbon halogen bond-containing compound, and an alkylamine.

From the viewpoint of further improving conductivity, the radical polymerization initiator is preferably at least one selected from the group consisting of an oxime compound, an alkylphenone compound, and a titanocene compound, more preferably an alkylphenone compound, and still more preferably at least one selected from the group consisting of an α-aminoalkylphenone compound, a benzyl ketal and alkylphenone.

The cationic polymerization initiator is preferably a photoacid generator.

As the photoacid generator, for example, a compound used for a chemically amplified photoresist or photocationic polymerization is used (refer to "Organic Material for Imaging" edited by The Organic Electronics Materials Research Association, Bun-shin Publication (1993), 187 to 192 pages). Among these, the photoacid generator is preferably an aromatic onium salt compound, more preferably an onium salt compound such as a diazonium salt, a phosphonium salt, a sulfonium salt, or an iodonium salt, and still more preferably a sulfonium salt or an iodonium salt.

The content of the polymerization initiator is preferably 0.5% by mass to 20% by mass, and more preferably 2% by mass to 10% by mass, with respect to the total amount of the ink for forming an insulating layer.

In the present disclosure, the ink for forming an insulating layer may contain other components different from the polymerization initiator and the polymerizable monomer. Examples of the other components include a chain transfer agent, a polymerization inhibitor, a sensitizer, a surfactant, and an additive.

—Chain Transfer Agent—

The ink for forming an insulating layer may contain at least one chain transfer agent.

From the viewpoint of improving reactivity of photopolymerization reaction, the chain transfer agent is preferably a polyfunctional thiol.

Examples of the polyfunctional thiol include aliphatic thiols such as hexane-1,6-dithiol, decane-1,10-dithiol, dimercaptodiethyl ether, and dimercaptodiethyl sulfide, aromatic thiols such as xylylene dimercaptan, 4,4'-dimercaptodiphenylsulfide, and 1,4-benzenedithiol; poly(mercaptoacetate) of a polyhydric alcohol such as ethylene glycol bis(mercaptoacetate), polyethylene glycol bis(mercaptoacetate), propylene glycol bis(mercaptoacetate), glycerin tris(mercaptoacetate), trimethylolethane tris(mercaptoacetate), trimethylolpropane tris(mercaptoacetate), pentaerythritol tetrakis(mercaptoacetate), and dipentaerythritol hexakis(mercaptoacetate); poly(3-mercaptopropionate) of a polyhydric alcohol such as ethylene glycol bis(3-mercaptopropionate), polyethylene glycol bis(3-mercaptopropionate), propylene glycol bis(3-mercaptopropionate), glycerin tris(3-mercaptopropionate), trimethylolethane tris(mercaptopropionate), trimethylolpropane tris(3-mercaptopropionate), pentaerythritol tetrakis(3-mercaptopropionate), and dipentaerythritol hexakis(3-mercaptopropionate); and poly(mercaptobutyrate) such as 1,4-bis(3-mercaptobutyryloxy)butane, 1,3,5-tris(3-mercaptobutyloxyethyl)-1,3,5-triazine-2,4,6(1H,3H,5H)-trione, and pentaerythritol tetrakis(3-mercaptobutyrate).

—Polymerization Inhibitor—

The ink for forming an insulating layer may contain at least one polymerization inhibitor.

Examples of the polymerization inhibitor include p-methoxyphenol, quinones (for example, hydroquinone, benzoquinone, and methoxybenzoquinone), phenothiazine, catechols, alkylphenols (for example, dibutyl hydroxy toluene (BHT)), alkyl bisphenols, zinc dimethyldithiocarbamate, copper dimethyldithiocarbamate, copper dibutyldithiocarbamate, copper salicylate, thiodipropionic acid esters, mercaptobenzimidazole, phosphites, 2,2,6,6-tetramethylpiperidine-1-oxyl (TEMPO), 2,2,6,6-tetramethyl-4-hydroxypiperidine-1-oxyl (TEMPOL), and tris(N-nitroso-N-phenylhydroxylamine)aluminum salt (also known as Cupferron A1).

Among these, as the polymerization inhibitor, at least one selected from p-methoxyphenol, catechols, quinones, alkylphenols, TEMPO, TEMPOL, and tris(N-nitroso-N-phenylhydroxylamine)aluminum salt is preferable, and at least one selected from p-methoxyphenol, hydroquinone, benzoquinone, BHT, TEMPO, TEMPOL, and tris(N-nitroso-N-phenylhydroxylamine)aluminum salt is more preferable.

In a case in which the ink for forming an insulating layer contains a polymerization inhibitor, the content of the polymerization inhibitor is preferably 0.01% by mass to 2.0% by mass, more preferably 0.02% by mass to 1.0% by mass, and particularly preferably 0.03% by mass to 0.5% by mass, with respect to the total amount of the ink.

—Sensitizer—

The ink for forming an insulating layer may contain at least one sensitizer.

Examples of the sensitizer include a polynuclear aromatic compound (for example, pyrene, perylene, triphenylene, and 2-ethyl-9,10-dimethoxyanthracene), a xanthene-based compound (for example, fluorescein, eosin, erythrosin, rhodamine B, and rose bengal), a cyanine-based compound (for example, thiacarbocyanine and oxacarbocyanine), a merocyanine-based compound (for example, merocyanine and carbomerocyanine), a thiazine-based compound (for example, thionine, methylene blue, and toluidine blue), an acridine-based compound (for example, acridine orange, chloroflavine, and acryflavine), anthraquinones (for example, anthraquinone), a squarylium-based compound (for example, squarylium), a coumarin-based compound (for example, 7-diethylamino-4-methylcoumarin), a thioxanthone-based compound (for example, isopropylthioxanthone), and a thiochromanone-based compound (for example, thiochromanone). Among these, the sensitizer is preferably a thioxanthone-based compound.

In a case in which the ink for forming an insulating layer contains a sensitizer, the content of the sensitizer is not particularly limited, but is preferably 1.0% by mass to 15.0% by mass, and more preferably 1.5% by mass to 5.0% by mass, with respect to the total amount of the ink for forming an insulating layer.

—Surfactant—

The ink for forming an insulating layer may contain at least one surfactant.

Examples of the surfactant include surfactants disclosed in JP1987-173463A (JP-S62-173463A) and JP1987-

183457A (JP-S62-183457A). In addition, examples of the surfactant include anionic surfactants such as dialkyl sulfosuccinate, alkyl naphthalene sulfonate, and a fatty acid salt; nonionic surfactants such as polyoxyethylene alkyl ether, polyoxyethylene alkyl allyl ether, acetylene glycol, and a polyoxyethylene-polyoxypropylene block copolymer; and cationic surfactants such as an alkylamine salt and a quaternary ammonium salt. In addition, the surfactant may be a fluorine-based surfactant or a silicone-based surfactant.

In a case in which the ink for forming an insulating layer contains a surfactant, the content of the surfactant is preferably ●% by mass to ●% by mass, and more preferably ●% by mass to ●% by mass, with respect to the total amount of the ink for forming an insulating layer.

—Organic Solvent—

The ink for forming an insulating layer may contain at least one organic solvent.

Examples of the organic solvent include (poly)alkylene glycol monoalkyl ethers such as ethylene glycol monoethyl ether, diethylene glycol monoethyl ether, triethylene glycol monomethyl ether, propylene glycol monomethyl ether (PGME), dipropylene glycol monomethyl ether, and tripropylene glycol monomethyl ether; (poly)alkylene glycol dialkyl ethers such as ethylene glycol dibutyl ether, diethylene glycol dimethyl ether, diethylene glycol diethyl ether, dipropylene glycol diethyl ether, and tetraethylene glycol dimethyl ether; (poly)alkylene glycol acetates such as diethylene glycol acetate; (poly)alkylene glycol diacetates such as ethylene glycol diacetate and propylene glycol diacetate; (poly)alkylene glycol monoalkyl ether acetates such as ethylene glycol monobutyl ether acetate and propylene glycol monomethyl ether acetate, ketones such as methyl ethyl ketone and cyclohexanone; lactones such as γ-butyrolactone; esters such as ethyl acetate, propyl acetate, butyl acetate, 3-methoxybutyl acetate (MBA), methyl propionate, and ethyl propionate; cyclic ethers such as tetrahydrofuran and dioxane; and amides such as dimethylformamide and dimethylacetamide.

In a case in which the ink for forming an insulating layer contains an organic solvent, the content of the organic solvent is preferably 70% by mass or less, and more preferably 50% by mass or less, with respect to the total amount of the ink for forming an insulating layer. A lower limit of the content of the organic solvent is not particularly limited. The content of the organic solvent may be 0% by mass.

—Additive—

As necessary, the ink for forming an insulating layer may contain an additive such as a co-sensitizer, an ultraviolet absorber, an antioxidant, an antifading agent, and a basic compound.

(Physical Properties)

From the viewpoint of improving jetting stability in a case in which the ink for forming an insulating layer is applied by using an ink jet recording method, a pH of the ink for forming an insulating layer is preferably 7 to 10, and more preferably 7.5 to 9.5. The pH is measured at 25° C. using a pH meter, such as a pH meter (model number "HM-31") manufactured by DKK-Toa Corporation.

The viscosity of the ink for forming an insulating layer is preferably 0.5 mPa·s to 60 mPa·s, and more preferably 2 mPa·s to 40 mPa·s. The viscosity is measured at 25° C. using a viscometer, such as a TV-22 type viscometer manufactured by Toki Sangyo Co., Ltd.

The surface tension of the ink for forming an insulating layer is preferably 60 mN/m or less, more preferably 20 mN/m to 50 mN/m, and still more preferably 25 mN/m to 45 mN/m. The surface tension is measured at 25° C. using a surface tension meter, for example, by a plate method using an automatic surface tension meter (trade name, "CBVP-Z") manufactured by Kyowa Interface Science Co., Ltd.

(Application of Ink for Forming Insulating Layer)

A method of applying the ink for forming an insulating layer is not particularly limited, and examples thereof include a known method such as a coating method and an ink jet recording method. Among these, from the viewpoint of making it possible to reduce a thickness of an insulating layer to be formed by applying once a small amount of droplets by means of jetting, the ink for forming an insulating layer is preferably applied by using an ink jet recording method.

The ink jet recording method may be any of an electric charge control method of jetting an ink by using electrostatic attraction force, a drop-on-demand method (pressure pulse method) using a vibration pressure of a piezo element, an acoustic ink jet method of jetting an ink by using a radiation pressure by means of converting electric signals into acoustic beams and irradiating the ink with the acoustic beams, or a thermal ink jet (Bubble Jet (registered trademark)) method of forming air bubbles by heating an ink and using the generated pressure.

As the ink jet recording method, particularly, an ink jet recording method, disclosed in JP1979-59936A (JP-S54-59936A), of jetting an ink from a nozzle using an action force caused by a rapid change in volume of the ink after being subjected to an action of thermal energy can be effectively used.

Regarding the ink jet recording method, the method disclosed in paragraphs 0093 to 0105 of JP2003-306623A can also be referred to.

Examples of ink jet heads used in the ink jet recording method include ink jet heads for a shuttle scan method of performing recording while scanning the heads in a width direction of the substrate using short serial heads and a line method using line heads each of which is formed of recording elements arranged for the entire region of one side of the substrate.

The amount of droplets of the ink for forming an insulating layer jetted from the ink jet head is preferably 1 pL (picoliter) to 100 pL, more preferably 3 pL to 80 pL, and still more preferably 3 pL to 20 pL.

(Irradiation with Active Energy Ray)

In the insulating layer forming step, the application of the ink for forming an insulating layer is carried out, and then the irradiation with an active energy ray is carried out.

Examples of the active energy ray include ultraviolet rays, visible rays, and electron beams. Among these, ultraviolet rays (hereinafter, also referred to as "UV") are preferable.

A peak wavelength of the ultraviolet rays is preferably 200 nm to 450 nm, more preferably 250 nm to 400 nm, and still more preferably 300 nm to 400 nm.

From the viewpoint of further suppressing the outflow of the ink for forming an insulating layer, the illuminance during the irradiation with the active energy ray is preferably 1 W/cm$^2$ or more, and more preferably 10 W/cm$^2$ or more. An upper limit of the illuminance is not particularly limited, but is, for example, 100 W/cm$^2$.

An exposure amount during the irradiation with an active energy ray is preferably 100 mJ/cm$^2$ to 10000 mJ/cm$^2$, and more preferably 300 mJ/cm$^2$ to 5000 mJ/cm$^2$. Note that in a case in which the application of the ink for forming an insulating layer and the irradiation with the active energy ray are defined as one cycle, the exposure amount mentioned herein means the exposure amount of the active energy ray in one cycle.

As a light source for ultraviolet irradiation, a mercury lamp, a gas laser, and a solid-state laser are mainly used, and a mercury lamp, a metal halide lamp, and an ultraviolet fluorescent lamp are widely known. In addition, a light emitting diode (UV-LED) and a laser diode (UV-LD) are compact, long-life, highly efficient, and low-cost, and are expected to be used as the light source for ultraviolet irradiation. Among these, the light source for ultraviolet irradiation is preferably a metal halide lamp, a high-pressure mercury lamp, a medium-pressure mercury lamp, a low-pressure mercury lamp, or UV-LED.

<Conductive Layer Forming Step>

In the conductive layer forming step, the ink for forming a conductive layer is applied onto at least a part of the ground electrode to form a conductive layer that is a cured film of the ink for forming a conductive layer. As described above, in a case in which the insulating layer forming step is included, the ink for forming a conductive layer is applied onto the insulating layer and at least a part of the ground electrode having an organic acid on the surface thereof.

Hereinafter, an example of the conductive layer forming step will be described with reference to FIGS. 4A and 4B.

Figure 4A:
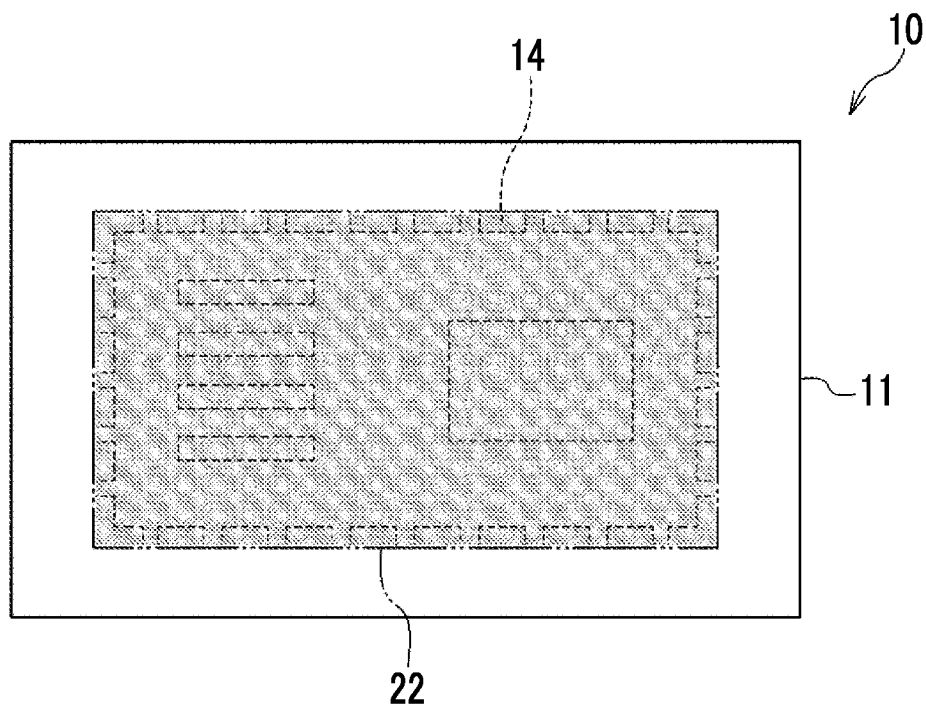
FIG. 4A is a diagram showing an example of an application region of an ink for forming a conductive layer.

FIG. 4A is a diagram showing an example of an application region of the ink for forming a conductive layer. FIG. 4B is a diagram showing a state where the conductive layer is formed in the cross-sectional view taken along the line A-A in FIG. 1.

Figure 4B:
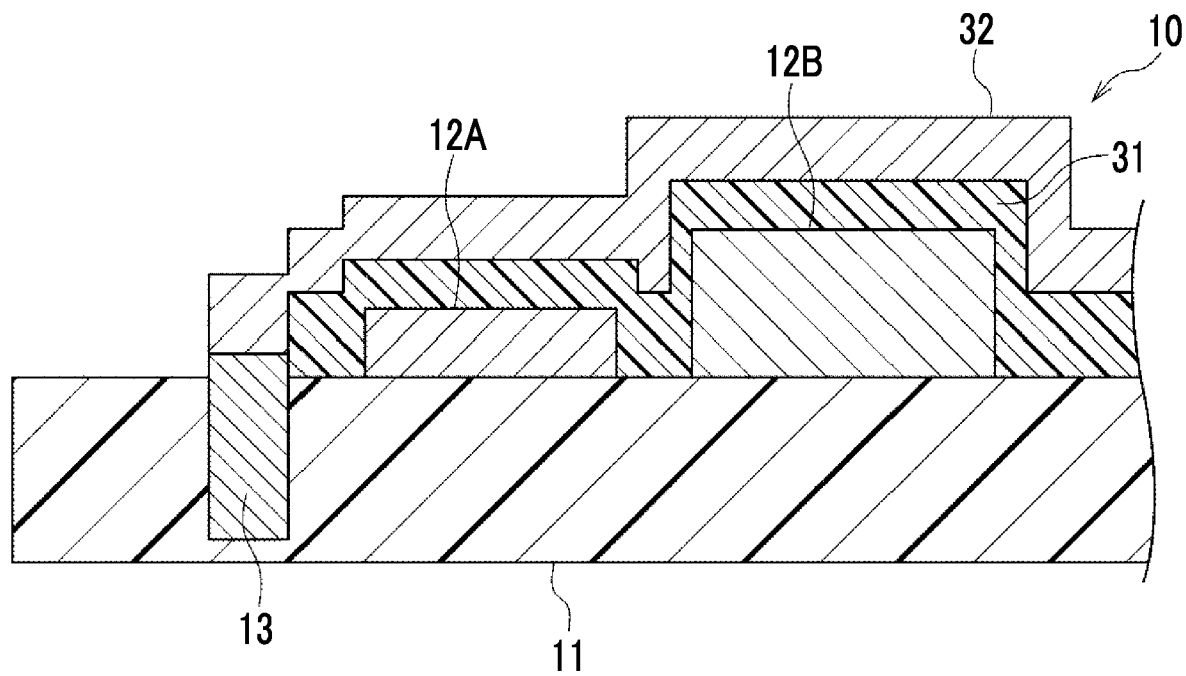
FIG. 4B is a diagram showing a state where a conductive layer is formed in the cross-sectional view taken along the line A-A in FIG. 1.

By applying the ink for forming a conductive layer onto the insulating layer 31 and at least a part of the ground electrode 13 having the organic acid 14 on the surface thereof, as shown in FIG. 4B, a conductive layer 32 is formed on the insulating layer 31 and at least a part of the ground electrode 13.

FIG. 4B shows an example in which the amount of organic acid is very small, which is a preferred aspect, and the organic acid may be present in the vicinity of the interface on the ground electrode 13.

It is preferable that the step of applying the ink for forming an insulating layer is repeated. By repeating the step, a thickness of the cured film of the ink for forming a conductive layer can be increased.

A region where the ink for forming a conductive layer is applied (an application region of the ink for forming a conductive layer) is set to at least a part of the ground electrode 13. In FIG. 4A, an application region 22 of the ink for forming a conductive layer is wider than the ground region, and is substantially the same as a region that includes the ground electrode 13 and is surrounded by the ground electrode 13.

In this example, the region 22 is set as the application region of the ink for forming an conductive layer, but the present disclosure is not limited to this example.

The region 22 can be appropriately set depending on the position and the shape of the electronic component 12 and the ground electrode 13 disposed on the wiring board 11.

A thickness of the conductive layer is preferably 0.1 μm to 100 μm, and more preferably 1 μm to 50 μm.

(Ink for Forming Conductive Layer)

In the present disclosure, the ink for forming a conductive layer means an ink for forming a conductive layer having conductivity. The term "conductive" means properties of having a volume resistivity of less than $10^8$ Ωcm.

The ink for forming a conductive layer is preferably an ink containing metal particles (hereinafter, also referred to as a "metal particle ink"), an ink containing a metal complex (hereinafter, also referred to as a "metal complex ink"), or an ink containing a metal salt (hereinafter, also referred to as a "metal salt ink"), and more preferably a metal complex ink or a metal salt ink.

From the viewpoint of improving the electromagnetic wave-shielding properties, the ink for forming a conductive layer is preferably an ink containing silver, and more preferably an ink containing a silver salt or an ink containing a silver complex.

<<Metal Particle Ink>>

The metal particle ink is, for example, an ink composition obtained by dispersing metal particles in a dispersion medium.

—Metal Particles—

Examples of the metal constituting the metal particles include base metal and noble metal particles. Examples of the base metal include nickel, titanium, cobalt, copper, chromium, manganese, iron, zirconium, tin, tungsten, molybdenum, and vanadium. Examples of the noble metal include gold, silver, platinum, palladium, iridium, osmium, ruthenium, rhodium, rhenium, and alloys containing these metals. Among these, from the viewpoint of the conductivity, the metal constituting the metal particles preferably includes at least one selected from the group consisting of silver, gold, platinum, nickel, palladium, and copper, and more preferably includes silver.

An average particle diameter of the metal particles is not particularly limited, but is preferably 10 nm to 500 nm, and more preferably 10 nm to 200 nm. In a case in which the average particle diameter is in the above range, a baking temperature of the metal particles is lowered, which improves process suitability for manufacturing a conductive ink film. In particular, in a case in which the metal particle ink is applied by using a spray method or an ink jet recording method, jettability is improved, which tends to improve pattern forming properties and film thickness uniformity of the conductive ink film. The average particle diameter mentioned herein means an average value of primary particle diameters of the metal particles (average primary particle diameter).

The average particle diameter of the metal particles is measured by a laser diffraction/scattering method. The average particle diameter of the metal particles is, for example, a value obtained by measuring a 50% cumulative volume-based diameter (D50) three times and calculating an average value of D50 measured three times, and can be measured by using a laser diffraction/scattering-type particle size distribution analyzer (trade name "LA-960" manufactured by Horiba, Ltd.).

In addition, the metal particle ink may contain metal particles having an average particle diameter of 500 nm or more, as necessary. In a case in which the metal particle ink contains metal particles having an average particle diameter of 500 nm or more, a melting point of the nm-sized metal particles is lowered around the μm-sized metal particles, which makes it possible to bond the conductive ink film.

The content of the metal particles in the metal particle ink is preferably 10% by mass to 90% by mass, and more preferably 20% by mass to 50% by mass, with respect to the total amount of the metal particle ink. In a case in which the content of the metal particles is 10% by mass or more, a surface resistivity is further reduced. In a case in which the content of the metal particles is 90% by mass or less, jettability is improved in a case in which the metal particle ink is applied by using an ink jet recording method.

In addition to the metal particles, the metal particle ink may contain, for example, a dispersing agent, a resin, a dispersion medium, a thickener, and a surface tension adjuster.

—Dispersing Agent—

The metal particle ink may contain a dispersing agent that adheres to at least a part of a surface of the metal particles. The dispersing agent substantially constitutes metal colloidal particles, together with the metal particles. The dispersing agent has an action of coating the metal particles to improve dispersibility of the metal particles and prevent aggregation. The dispersing agent is preferably an organic compound capable of forming the metal colloidal particles. From the viewpoint of conductivity and dispersion stability, the dispersing agent is preferably an amine, a carboxylic acid, an alcohol, or a resin dispersing agent.

The metal particle ink may contain one dispersing agent or two or more dispersing agents.

Examples of the amine include saturated or unsaturated aliphatic amines. Among these, the amine is preferably an aliphatic amine having 4 to 8 carbon atoms. The aliphatic amine having 4 to 8 carbon atoms may be linear or branched, or may have a ring structure.

Examples of the aliphatic amine include butylamine, normal pentylamine, isopentylamine, hexylamine, 2-ethylhexylamine, and octylamine.

Examples of the amine having an alicyclic structure include cycloalkylamines such as cyclopentylamine and cyclohexylamine.

Examples of an aromatic amine include aniline.

The amine may have a functional group other than an amino group. Examples of the functional group other than an amino group include a hydroxy group, a carboxy group, an alkoxy group, a carbonyl group, an ester group, and a mercapto group.

Examples of the carboxylic acid include formic acid, oxalic acid, acetic acid, hexanoic acid, acrylic acid, octylic acid, oleic acid, tianshic acid, ricinoleic acid, gallic acid, and salicylic acid. A carboxy group, which is a part of the carboxylic acid, may form a salt with a metal ion. The salt may be formed of one metal ion or two or more metal ions.

The carboxylic acid may have a functional group other than the carboxy group. Examples of the functional group other than the carboxy group include an amino group, a hydroxy group, an alkoxy group, a carbonyl group, an ester group, and a mercapto group.

Examples of the alcohol include a terpene-based alcohol, an allyl alcohol, and an oleyl alcohol. The alcohol is likely to be coordinated with the surface of the metal particles, and can suppress the aggregation of the metal particles.

Examples of the resin dispersing agent include a dispersing agent that has a nonionic group as a hydrophilic group and can be uniformly dissolved in a solvent. Examples of the resin dispersing agent include polyvinylpyrrolidone, polyethylene glycol, a polyethylene glycol-polypropylene glycol copolymer, polyvinyl alcohol, polyallylamine, and a polyvinyl alcohol-polyvinyl acetate copolymer. A molecular weight of the resin dispersing agent is preferably 1000 to 50000, and more preferably 1000 to 30000, in terms of a weight-average molecular weight.

The content of the dispersing agent in the metal particle ink is preferably 0.1% by mass to 20% by mass, and more preferably 0.1% by mass to 10% by mass, with respect to the total amount of the metal particle ink.

—Dispersion Medium—

The metal particle ink preferably contains a dispersion medium. A type of the dispersion medium is not particularly limited, and examples thereof include a hydrocarbon, an alcohol, and water.

The metal particle ink may contain one dispersion medium or two or more dispersion media. The dispersion medium contained in the metal particle ink is preferably volatile. A boiling point of the dispersion medium is preferably 50° C. to 250° C., more preferably 70° C. to 220° C., and still more preferably 80° ° C. to 200° C. In a case in which the boiling point of the dispersion medium is 50° C. to 250° C., the stability and baking properties of the metal particle ink tend to be simultaneously achieved.

Examples of the hydrocarbon include an aliphatic hydrocarbon and an aromatic hydrocarbon.

Examples of the aliphatic hydrocarbon include a saturated or unsaturated aliphatic hydrocarbon such as tetradecane, octadecane, heptamethylnonane, tetramethylpentadecane, hexane, heptane, octane, nonane, decane, tridecane, methylpentane, normal paraffin, or isoparaffin.

Examples of the aromatic hydrocarbon include toluene and xylene.

Examples of the alcohol include an aliphatic alcohol and an alicyclic alcohol. In a case in which an alcohol is used as the dispersion medium, the dispersing agent is preferably an amine or a carboxylic acid.

Examples of the aliphatic alcohol include a saturated or unsaturated aliphatic alcohol having 6 to 20 carbon atoms that may contain an ether bond in a chain, such as heptanol, octanol (for example, 1-octanol, 2-octanol, or 3-octanol), decanol (for example, 1-decanol), lauryl alcohol, tetradecyl alcohol, cetyl alcohol, 2-ethyl-1-hexanol, octadecyl alcohol, hexadecenol, and oleyl alcohol.

Examples of the alicyclic alcohol include a cycloalkanol such as cyclohexanol; a terpene alcohol such as terpineol (including $\alpha$, $\beta$, and $\gamma$ isomers, or any mixture of these) or dihydroterpineol; dihydroterpineol, myrtenol, sobrerol, menthol, carveol, perillyl alcohol, pinocarveol, and verbenol.

The dispersion medium may be water. From the viewpoint of adjusting physical properties such as viscosity, surface tension, and volatility, the dispersion medium may be a mixed solvent of water and another solvent. Another solvent to be mixed with water is preferably an alcohol. The alcohol used together with water is preferably an alcohol that is miscible with water and has a boiling point of 130° C. or lower. Examples of the alcohol include 1-propanol, 2-propanol, 1-butanol, 2-butanol, tert-butanol, 1-pentanol, ethylene glycol monomethyl ether, ethylene glycol monoethyl ether, ethylene glycol monopropyl ether, propylene glycol monomethyl ether.

The content of the dispersion medium in the metal particle ink is preferably 1% by mass to 50% by mass, with respect to the total amount of the metal particle ink. In a case in which the content of the dispersion medium is 1% by mass to 50% by mass, the metal particle ink can obtain sufficient conductivity as a conductive ink. The content of the dispersion medium is more preferably 10% by mass to 45% by mass, and still more preferably 20% by mass to 40% by mass.

—Resin—

The metal particle ink may contain a resin. Examples of the resin include polyester, polyurethane, a melamine resin, an acrylic resin, a styrene-based resin, a polyether, and a terpene resin.

The metal particle ink may contain one resin or two or more resins.

The content of the resin in the metal particle ink is preferably 0.1% by mass to 5% by mass with respect to the total amount of the metal particle ink.

—Thickener—

The metal particle ink may contain a thickener. Examples of the thickener include clay minerals such as clay, bentonite, and hectorite; cellulose derivatives such as methyl cellulose, carboxymethyl cellulose, hydroxyethyl cellulose, hydroxypropyl cellulose, and hydroxypropyl methyl cellulose; and polysaccharides such as xanthan gum and guar gum.

The metal particle ink may contain one thickener or two or more thickeners.

The content of the thickener in the metal particle ink is preferably 0.1% by mass to 5% by mass with respect to the total amount of the metal particle ink.

—Surfactant—

The metal particle ink may contain a surfactant. In a case in which the metal particle ink contains a surfactant, a uniform conductive ink film is likely to be formed.

The surfactant may be any of an anionic surfactant, a cationic surfactant, or a nonionic surfactant. Among these, the surfactant is preferably a fluorine-based surfactant from the viewpoint of being able to adjust the surface tension with a small amount of content. In addition, the surfactant is preferably a compound having a boiling point higher than 250° C.

The viscosity of the metal particle ink is not particularly limited. The viscosity of the metal particle ink need only be 0.01 mPa·s to 5000 mPa·s, and is preferably 0.1 mPa·s to 500 mPa·s. In a case in which the metal particle ink is applied by using a spray method or an ink jet recording method, the viscosity of the metal particle ink is preferably 1 mPa·s to 100 mPa·s, more preferably 2 mPa·s to 50 mPa·s, and still more preferably 3 mPa·s to 30 mPa·s.

The viscosity of the metal particle ink is a value measured at 25° C. by using a viscometer. The viscosity is measured using, for example, a VISCOMETER TV-22 type viscometer (manufactured by Toki Sangyo Co., Ltd.).

The surface tension of the metal particle ink is not particularly limited, and is preferably 20 mN/m to 45 mN/m and more preferably 25 mN/m to 40 mN/m.

The surface tension is a value measured at 25° C. by using a surface tension meter.

The surface tension of the metal particle ink is measured using, for example, DY-700 (manufactured by Kyowa Interface Science Co., Ltd.).

—Manufacturing Method of Metal Particles—

The metal particles may be a commercially available product or may be manufactured by a known method. Examples of a manufacturing method of the metal particles include a wet reduction method, a vapor phase method, and a plasma method. Preferred examples of the manufacturing method of the metal particles include a wet reduction method capable of manufacturing metal particles having an average particle diameter of 200 nm or less and having a narrow particle size distribution. Examples of the manufacturing method of the metal particles by a wet reduction method include the method disclosed in JP2017-37761A, WO2014-57633A, and the like, the method including: a step of mixing a metal salt with a reducing agent to obtain a complexing reaction solution; and a step of heating the complexing reaction solution to reduce metal ions in the complexing reaction solution and to obtain a slurry of metal nanoparticles.

In manufacturing the metal particle ink, a heat treatment may be performed such that the content of each component contained in the metal particle ink is adjusted to be in a predetermined range. The heat treatment may be performed under reduced pressure or under normal pressure. In a case in which the heat treatment is performed under normal pressure, the heat treatment may be performed in the atmospheric air or in an inert gas atmosphere.

<<Metal Complex Ink>>

The metal complex ink is, for example, an ink composition obtained by dissolving a metal complex in a solvent.

—Metal Complex—

Examples of metals constituting the metal complex include silver, copper, gold, aluminum, magnesium, tungsten, molybdenum, zinc, nickel, iron, platinum, tin, and lead. Among these, from the viewpoint of conductivity, the metal constituting the metal complex preferably includes at least one selected from the group consisting of silver, gold, platinum, nickel, palladium, and copper, and more preferably includes silver.

The content of the metal contained in the metal complex ink is preferably 1% by mass to 40% by mass, more preferably 5% by mass to 30% by mass, and still more preferably 7% by mass to 20% by mass, with respect to the total amount of the metal complex ink, in terms of the metal element.

The metal complex can be obtained, for example, by reacting a metal salt with a complexing agent. Examples of a manufacturing method of the metal complex include a method of adding a metal salt and a complexing agent to a solvent and stirring the mixture for a predetermined time. The stirring method is not particularly limited, and can be appropriately selected from known methods such as a stirring method using a stirrer, a stirring blade, or a mixer, and a method of applying ultrasonic waves.

Examples of the metal salt include thiocyanate, sulfide, chloride, cyanide, cyanate, carbonate, nitrate, nitrite, sulfate, phosphate, perchlorate, tetrafluoroborate, an acetyl acetonate complex salt, and carboxylate.

From the viewpoint of conductivity and storage stability, the metal salt is preferably a carboxylate. The carboxylic acid forming the carboxylate is preferably at least one selected from the group consisting of carboxylic acids having 1 to 20 carbon atoms, and more preferably a carboxylic acid having 1 to 16 carbon atoms, and still more preferably a fatty acid having 2 to 12 carbon atoms. The fatty acid may be linear or branched or may have a substituent.

Examples of the linear fatty acid include formic acid, acetic acid, propionic acid, butyric acid, valeric acid, caproic acid, caprylic acid, pelargonic acid, capric acid, undecanoic acid, lauric acid, myristic acid, palmitic acid, stearic acid, palmitoleic acid, oleic acid, linoleic acid, and linolenic acid.

Examples of the branched fatty acid include isobutyric acid, isovaleric acid, 2-ethylhexanoic acid, neodecanoic acid, pivalic acid, 2-methylpentanoic acid, 3-methylpentanoic acid, 4-methylpentanoic acid, 2,2-dimethylbutanoic acid, 2,3-dimethylbutanoic acid, 3,3-dimethylbutanoic acid, and 2-ethylbutanoic acid.

Examples of the carboxylic acid having a substituent include hexafluoroacetylacetonate, glycolic acid, lactic acid, 3-hydroxybutyric acid, 2-methyl-3-hydroxybutyric acid, 3-methoxybutyric acid, and acetoacetic acid.

Examples of the polyfunctional carboxylic acid include oxalic acid, succinic acid, glutaric acid, malonic acid, acetonedicarboxylic acid, 3-hydroxyglutaric acid, 2-methyl-3-hydroxyglutaric acid, and 2,2,4,4-hydroxyglutaric acid, and citric acid.

Among these, the metal salt is preferably an alkyl carboxylate having 2 to 12 carbon atoms, oxalate, or acetoacetate, and more preferably an alkyl carboxylate having 2 to 12 carbon atoms.

Examples of the complexing agent include an amine, an ammonium carbamate-based compound, an ammonium carbonate-based compound, and an ammonium bicarbonate compound. Among these, from the viewpoint of the conductivity and stability of the metal complex, the complexing agent preferably includes at least one selected from the group consisting of an amine, an ammonium carbamate-based compound, and an ammonium carbonate-based compound.

The metal complex has a structure derived from a complexing agent, and preferably has a structure derived from at least one selected from the group consisting of an amine, an ammonium carbamate-based compound, and an ammonium carbonate-based compound.

Examples of the amine as a complexing agent include ammonia, a primary amine, a secondary amine, a tertiary amine, and a polyamine.

Examples of the primary amine having a linear alkyl group include methylamine, ethylamine, n-propylamine, n-butylamine, n-pentylamine, n-hexylamine, n-heptylamine, n-octylamine, n-nonylamine, n-decylamine, undecylamine, n-dodecylamine, n-tridecylamine, n-tetradecylamine, n-pentadecylamine, n-hexadecylamine, n-heptadecylamine, and n-octadecylamine.

Examples of the primary amine having a branched alkyl group include isopropylamine, sec-butylamine, tert-butylamine, isopentylamine, 2-ethylhexylamine, and tert-octylamine.

Examples of the primary amine having an alicyclic structure include cyclopentylamine, cyclohexylamine, and dicyclohexylamine.

Examples of the primary amine having a hydroxyalkyl group include ethanolamine, propanolamine, and isopropanolamine.

Examples of the primary amine having an aromatic ring include benzylamine, aniline, N,N-dimethylaniline, and 4-aminopyridine.

Examples of the secondary amine include dimethylamine, diethylamine, dipropylamine, dibutylamine, diphenylamine, dicyclopentylamine, methylbutylamine, diethanolamine, N-methylethanolamine, dipropanolamine, and diisopropanolamine.

Examples of the tertiary amine include trimethylamine, triethylamine, tripropylamine, triethanolamine, tripropanolamine, triisopropanolamine, triphenylamine, N,N-dimethylaniline, N,N-dimethyl-p-toluidine, and 4-dimethylaminopyridine.

Examples of the polyamine include ethylenediamine, 1,2-diaminopropane, 1,3-diaminopropane, diethylenetriamine, triethylenetetramine, tetramethylenepentamine, hexamethylenediamine, tetraethylenepentamine, and a combination of these.

The amine is preferably an alkylamine, more preferably an alkylamine having 2 to 12 carbon atoms, and still more preferably a primary alkylamine having 2 to 8 carbon atoms. The metal complex may be configured of one amine or two or more amines.

In reacting the metal salt with an amine, a ratio of the molar amount of the amine to a molar amount of the metal salt is preferably 1/1 to 15/1, and more preferably 1.5/1 to 6/1. In a case in which the above ratio is within the above range, the complex formation reaction is completed, and a transparent solution is obtained.

Examples of the ammonium carbamate-based compound as a complexing agent include ammonium carbamate, methylammonium methylcarbamate, ethylammonium ethylcarbamate, 1-propylammonium 1-propylcarbamate, isopropylammonium isopropylcarbamate, butylammonium butylcarbamate, isobutylammonium isobutylcarbamate, amylammonium amylcarbamate, hexylammonium hexylcarbamate, heptylammonium heptylcarbamate, octylammonium octylcarbamate, 2-ethylhexylammonium 2-ethylhexylcarbamate, nonylammonium nonylcarbamate, and decylammonium decylcarbamate.

Examples of the ammonium carbonate-based compound as a complexing agent include ammonium carbonate, methylammonium carbonate, ethylammonium carbonate, 1-propylammonium carbonate, isopropylammonium carbonate, butylammonium carbonate, isobutylammonium carbonate, amylammonium carbonate, hexylammonium carbonate, heptylammonium carbonate, octylammonium carbonate, 2-ethylhexylammonium carbonate, nonylammonium carbonate, and decylammonium carbonate.

Examples of the ammonium bicarbonate-based compound as a complexing agent include ammonium bicarbonate, methylammonium bicarbonate, ethylammonium bicarbonate, 1-propylammonium bicarbonate, isopropylammonium bicarbonate, butylammonium bicarbonate, isobutylammonium bicarbonate, amylammonium bicarbonate, hexylammonium bicarbonate, heptylammonium bicarbonate, octylammonium bicarbonate, 2-ethylhexylammonium bicarbonate, nonylammonium bicarbonate, and decylammonium bicarbonate.

In reacting the metal salt with an ammonium carbamate-based compound, an ammonium carbonate-based compound, or an ammonium bicarbonate-based compound, a ratio of a molar amount of the ammonium carbamate-based compound, the ammonium carbonate-based compound, or the ammonium bicarbonate-based compound to the molar amount of the metal salt is preferably 0.01/1 to 1/1, and more preferably 0.05/1 to 0.6/1.

The content of the metal complex in the metal complex ink is preferably 10% by mass to 90% by mass, and more preferably 10% by mass to 40% by mass, with respect to the total amount of the metal complex ink. In a case in which the content of the metal complex is 10% by mass or more, the surface resistivity is further reduced. In a case in which the content of the metal complex is 90% by mass or less, jettability is improved in a case in which the metal complex ink is applied by using an ink jet recording method.

—Solvent—

The metal complex ink preferably contains a solvent. The solvent is not particularly limited as long as it can dissolve the component contained in the metal complex ink, such as the metal complex. From the viewpoint of ease of manufacturing, a boiling point of the solvent is preferably 30° C. to 300° C., more preferably 50° C. to 200° C., and still more preferably 50° C. to 150° C.

The content of the solvent in the metal complex ink is preferably set such that the concentration of metal ions with respect to the metal complex (the amount of the metal present as free ions with respect to 1 g of the metal complex) is 0.01 mmol/g to 3.6 mmol/g, and more preferably set such that the concentration of metal ions is 0.05 mmol/g to 2 mmol/g. In a case in which the concentration of metal ions is within the above range, the metal complex ink has excellent fluidity and can obtain conductivity.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water. The metal complex ink may contain only one solvent or two or more solvents.

The hydrocarbon is preferably a linear or branched hydrocarbon having 6 to 20 carbon atoms. Examples of the hydrocarbon include pentane, hexane, heptane, octane, nonane, decane, undecane, dodecane, tridecane, tetradecane, pentadecane, hexadecane, octadecane, nonadecane, and icosane.

The cyclic hydrocarbon is preferably a cyclic hydrocarbon having 6 to 20 carbon atoms. The cyclic hydrocarbons can include, for example, cyclohexane, cycloheptane, cyclooctane, cyclononane, cyclodecane, and decalin.

Examples of the aromatic hydrocarbon include benzene, toluene, xylene, and tetraline.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, eicosyl alcohol, and isoeicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

—Reducing Agent—

The metal complex ink may contain a reducing agent. In a case in which the metal complex ink contains a reducing agent, reduction of the metal complex into a metal is facilitated.

Examples of the reducing agent include a borohydride metal salt, an aluminum hydride salt, an amine, an alcohol, an aldehyde, an organic acid, reduced sugar, a sugar alcohol, sodium sulfite, a hydrazine compound, dextrin, hydroquinone, hydroxylamine, ethylene glycol, glutathione, and an oxime compound.

The reducing agent may be the oxime compound disclosed in JP2014-516463A. Examples of the oxime compound include acetone oxime, cyclohexanone oxime, 2-butanone oxime, 2,3-butanedione monoxime, dimethyl glyoxime, methyl acetoacetate monoxime, methyl pyruvate monoxime, benzaldehyde oxime, 1-indanone oxime, 2-adamantanone oxime, 2-methylbenzamide oxime, 3-methylbenzamide oxime, 4-methylbenzamide oxime, 3-aminobenzamide oxime, 4-aminobenzamide oxime, acetophenone oxime, benzamide oxime, and pinacolone oxime.

The metal complex ink may contain one reducing agent or two or more reducing agents.

The content of the reducing agent in the metal complex ink is not particularly limited, but is preferably 0.1% by mass to 20% by mass, more preferably 0.3% by mass to 10% by mass, and still more preferably 1% by mass to 5% by mass, with respect to the total amount of the metal complex ink.

—Resin—

The metal complex ink may contain a resin. In a case in which the metal complex ink contains a resin, adhesiveness of the metal complex ink to the electronic substrate is improved.

Examples of the resin include polyester, polyethylene, polypropylene, polyacetal, polyolefin, polycarbonate, polyamide, a fluororesin, a silicone resin, ethyl cellulose, hydroxyethyl cellulose, rosin, an acrylic resin, polyvinyl chloride, polysulfone, polyvinylpyrrolidone, polyvinyl alcohol, a polyvinyl-based resin, polyacrylonitrile, polysulfide, polyamideimide, polyether, polyarylate, polyether ether ketone, polyurethane, an epoxy resin, a vinyl ester resin, a phenol resin, a melamine resin, and a urea resin.

The metal complex ink may contain one resin or two or more resins.

—Additive—

As long as the effects of the present disclosure are not reduced, the metal complex ink may further contain additives such as an inorganic salt, an organic salt, an inorganic oxide such as silica, a surface conditioner, a wetting agent, a crosslinking agent, an antioxidant, a rust inhibitor, a heat-resistant stabilizer, a surfactant, a plasticizer, a curing agent, a thickener, and a silane coupling agent. The total content of the additives in the metal complex ink is preferably 20% by mass or less with respect to the total amount of the metal complex ink.

The viscosity of the metal complex ink is not particularly limited. The viscosity of the metal complex ink need only be 0.001 Pa·s to 5000 Pa·s, and is preferably 0.001 Pa·s to 100 Pa·s. In a case in which the metal complex ink is applied by using a spray method or an ink jet recording method, the viscosity of the metal complex ink is preferably 1 mPa·s to 100 mPa·s, more preferably 2 mPa·s to 50 mPa·s, and still more preferably 3 mPa·s to 30 mPa·s.

The viscosity of the metal complex ink is a value measured at 25° C. by using a viscometer. The viscosity is measured using, for example, a VISCOMETER TV-22 type viscometer (manufactured by Toki Sangyo Co., Ltd.).

The surface tension of the metal complex ink is not particularly limited, and is preferably 20 mN/m to 45 mN/m and more preferably 25 mN/m to 35 mN/m. The surface tension is a value measured at 25° C. by using a surface tension meter.

The surface tension of the metal complex ink is measured using, for example, DY-700 (manufactured by Kyowa Interface Science Co., Ltd.).

<<Metal Salt Ink>>

The metal salt ink is, for example, an ink composition obtained by dissolving a metal salt in a solvent.

—Metal Salt—

Examples of metals constituting the metal salt include silver, copper, gold, aluminum, magnesium, tungsten, molybdenum, zinc, nickel, iron, platinum, tin, and lead. Among these, from the viewpoint of conductivity, the metal constituting the metal salt preferably includes at least one selected from the group consisting of silver, gold, platinum, nickel, palladium, and copper, and more preferably includes silver.

The content of the metal contained in the metal salt ink is preferably 1% by mass to 40% by mass, more preferably 5% by mass to 30% by mass, and still more preferably 7% by mass to 20% by mass, with respect to the total amount of the metal salt ink, in terms of the metal element. The content of the metal salt in the metal salt ink is preferably 10% by mass to 90% by mass, and more preferably 10% by mass to 40% by mass, with respect to the total amount of the metal salt ink. In a case in which the content of the metal salt is 10% by mass or more, the surface resistivity is further reduced. In a case in which the content of the metal salt is 90% by mass or less, jettability is improved in a case in which the metal particle ink is applied by using a spray method or an ink jet recording method.

As the metal salt, the same metal salt as the metal salt used in the metal complex ink can be used. Among these, the metal salt is preferably a carboxylate. As the carboxylic acid forming the carboxylate, an alkyl carboxylate having 6 to 12 carbon atoms or acetoacetic is preferable, and an alkyl carboxylate having 6 to 12 carbon atoms is more preferable. Two or more carboxylates may be combined.

The metal salt may be a commercially available product or may be manufactured by a known method. A silver salt is manufactured, for example, by the following method.

First, a silver compound (for example, silver acetate) functioning as a silver supply source and formic acid or a fatty acid having 1 to 30 carbon atoms in the same quantity as the molar equivalent of the silver compound are added to an organic solvent such as ethanol. The mixture is stirred for a predetermined time by using an ultrasonic stirrer, and the formed precipitate is washed with ethanol and decanted. All of these steps can be performed at a room temperature (25° C.). A mixing ratio of the silver compound and the formic acid or fatty acid having 1 to 30 carbon atoms is preferably 1:2 to 2:1, and more preferably 1:1, in terms of molar ratio.

The metal salt ink preferably contains a solvent.

A type of the solvent is not particularly limited as long as it can dissolve the metal salt contained in the metal salt ink.

From the viewpoint of ease of manufacturing, the boiling point of the solvent is preferably 30° C. to 300° C., more preferably 50° ° C. to 300° C., and still more preferably 50° C. to 250° C.

The content of the solvent in the metal salt ink is preferably set such that the concentration of metal ions with respect to the metal salt (the amount of the metal present as free ions with respect to 1 g of the metal salt) is 0.01 mmol/g to 3.6 mmol/g, and more preferably set such that the concentration of metal ions is 0.05 mmol/g to 2.6 mmol/g. In a case in which the concentration of metal ions is within the above range, the metal salt ink has excellent fluidity and can obtain the electromagnetic wave-shielding properties.

Examples of the solvent include a hydrocarbon, a cyclic hydrocarbon, an aromatic hydrocarbon, a carbamate, an alkene, an amide, an ether, an ester, an alcohol, a thiol, a thioether, phosphine, and water.

The metal salt ink may contain only one solvent or two or more solvents.

The solvent preferably contains an aromatic hydrocarbon.

Examples of the aromatic hydrocarbon include benzene, toluene, xylene, ethylbenzene, propylbenzene, isopropylbenzene, butylbenzene, isobutylbenzene, t-butylbenzene, trimethylbenzene, pentylbenzene, hexylbenzene, tetraline, benzyl alcohol, phenol, cresol, methyl benzoate, ethyl benzoate, propyl benzoate, and butyl benzoate.

From the viewpoint of compatibility with other components, the number of aromatic rings in the aromatic hydrocarbon is preferably 1 or 2, and more preferably 1.

From the viewpoint of ease of manufacturing, a boiling point of the aromatic hydrocarbon is preferably 50° ° C. to 300° C., more preferably 60° ° C. to 250° ° C., and still more preferably 80° C. to 200° C.

The solvent may contain an aromatic hydrocarbon and a hydrocarbon other than the aromatic hydrocarbon.

Examples of the hydrocarbon other than the aromatic hydrocarbon include a linear hydrocarbon having 6 to 20 carbon atoms, a branched hydrocarbon having 6 to 20 carbon atoms, and an alicyclic hydrocarbon having 6 to 20 carbon atoms.

Examples of the hydrocarbon other than the aromatic hydrocarbon include pentane, hexane, heptane, octane, nonane, decane, undecane, dodecane, tridecane, tetradecane, pentadecane, hexadecane, octadecane, nonadecane, decalin, cyclohexane, cycloheptane, cyclooctane, cyclononane, cyclodecane, decene, a terpene-based compound, and icosane.

The hydrocarbon other than the aromatic hydrocarbon preferably contains an unsaturated bond.

Examples of the hydrocarbon containing an unsaturated bond other than the aromatic hydrocarbon include a terpene-based compound.

Depending on the number of isoprene units constituting the terpene-based compound, the terpene-based compound is classified into, for example, a hemiterpene, a monoterpene, a sesquiterpene, a diterpene, a sesterterpene, a triterpene, a sesquarterpene, and a tetraterpene.

The terpene-based compound as the solvent may be any of the above compounds, but is preferably a monoterpene.

Examples of the monoterpene include pinene (α-pinene and β-pinene), terpineol (α-terpineol, β-terpineol, and γ-terpineol), myrcene, camphene, limonene (d-limonene, 1-limonene, and dipentene), ocimene (α-ocimene and β-ocimene), alloocimene, phellandrene (α-phellandrene and β-phellandrene), terpinene (α-terpinene and γ-terpinene), terpinolene (α-terpinolene, β-terpinolene, γ-terpinolene, and δ-terpinolene), 1,8-cineole, 1,4-cineole, sabinene, paramenthadiene, and carene (δ-3-carene).

As the monoterpene, a cyclic monoterpene is preferable, and pinene, terpineol, or carene is more preferable.

The ether may be any of a linear ether, a branched ether, or a cyclic ether. Examples of the ether include diethyl ether, dipropyl ether, dibutyl ether, methyl-t-butyl ether, tetrahydrofuran, tetrahydropyrane, dihydropyrane, and 1,4-dioxane.

The alcohol may be any of a primary alcohol, a secondary alcohol, or a tertiary alcohol.

Examples of the alcohol include ethanol, 1-propanol, 2-propanol, 1-methoxy-2-propanol, 1-butanol, 2-butanol, 1-pentanol, 2-pentanol, 3-pentanol, 1-hexanol, 2-hexanol, 3-hexanol, 1-octanol, 2-octanol, 3-octanol, tetrahydrofurfuryl alcohol, cyclopentanol, terpineol, decanol, isodecyl alcohol, lauryl alcohol, isolauryl alcohol, myristyl alcohol, isomyristyl alcohol, cetyl alcohol (cetanol), isocetyl alcohol, stearyl alcohol, isostearyl alcohol, oleyl alcohol, isooleyl alcohol, linoleyl alcohol, isolinoleyl alcohol, palmityl alcohol, isopalmityl alcohol, eicosyl alcohol, and isoeicosyl alcohol.

Examples of the ketone include acetone, methyl ethyl ketone, methyl isobutyl ketone, and cyclohexanone.

Examples of the ester include methyl acetate, ethyl acetate, isopropyl acetate, butyl acetate, isobutyl acetate, sec-butyl acetate, methoxybutyl acetate, ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, propylene glycol monoethyl ether acetate, propylene glycol monobutyl ether acetate, dipropylene glycol monomethyl ether acetate, dipropylene glycol monoethyl ether acetate, dipropylene glycol monobutyl ether acetate, and 3-methoxybutyl acetate.

The viscosity of the metal salt ink is not particularly limited. The viscosity of the metal salt ink need only be 0.001 Pa·s to 5000 Pa·s, and is preferably 0.001 Pa·s to 100 Pa·s. In a case in which the metal salt ink is applied by using a spray method or an ink jet recording method, the viscosity of the metal salt ink is preferably 1 mPa·s to 100 mPa·s, more preferably 2 mPa·s to 50 mPa·s, and still more preferably 3 mPa·s to 30 mPa·s.

The viscosity of the metal salt ink is a value measured at 25° C. by using a viscometer.

The viscosity is measured using, for example, a VISCOMETER TV-22 type viscometer (manufactured by Toki Sangyo Co., Ltd.).

The surface tension of the metal salt ink is not particularly limited, and is preferably 20 mN/m to 45 mN/m and more preferably 25 mN/m to 35 mN/m. The surface tension is a value measured at 25° C. by using a surface tension meter.

The surface tension of the metal salt ink is measured using, for example, DY-700 (manufactured by Kyowa Interface Science Co., Ltd.).

(Application of Ink for Forming Conductive Layer)

A method of applying the ink for forming a conductive layer is not particularly limited, and examples thereof include a known method such as a coating method and an ink jet recording method. Among these, from the viewpoint of making it possible to reduce a thickness of a conductive layer to be formed by applying once a small amount of droplets by means of jetting, the ink for forming a conductive layer is preferably applied by using an ink jet recording method.

A preferred aspect of the ink jet recording method is the same as the preferred aspect of the ink jet recording method in the application of the ink for forming an insulating layer.

It is preferable to preheat the electronic substrate on which the insulating layer is formed, before applying the ink for forming a conductive layer. A temperature of the electronic substrate in a case of applying the ink for forming a conductive layer is preferably 20° C. to 120° C., and more preferably 40° C. to 100° C.

(Formation of Conductive Layer)

It is preferable that the ink for forming a conductive layer is cured using heat or light after being applied onto the insulating layer. Since the specific carboxylic acid included in the organic acid 14 has a molecular weight of less than 350, the specific carboxylic acid evaporates in the step of curing the ink for forming a conductive layer using heat or light.

In a case in which the ink for forming a conductive layer is cured using heat, it is preferable that a baking temperature is 250° C. or lower, and a baking time is 1 minute to 120 minutes. In a case in which the baking temperature and the baking time are in the above ranges, the damage of the electronic substrate is suppressed.

The baking temperature is preferably 80° C. to 250° C., and more preferably 100° C. to 200° C. The baking time is preferably 1 minute to 60 minutes.

The baking method is not particularly limited, and a generally known method can be used.

A time from a time point at which the application of the ink for forming a conductive layer is completed to a time point at which the baking is started is preferably 60 seconds or less. A lower limit of the time is not particularly limited, but is, for example, 20 seconds. In a case in which the time is 60 seconds or less, the conductivity is improved.

The phrase "time point at which the application of the conductive ink is completed" refers to a time point at which all the droplets of the ink for forming a conductive layer have been landed on the insulating layer.

In a case in which the ink for forming a conductive layer is cured using light, examples of the light include ultraviolet rays and infrared rays.

A peak wavelength of the ultraviolet rays is preferably 200 nm to 405 nm, more preferably 250 nm to 400 nm, and still more preferably 300 nm to 400 nm.

An exposure amount during the light irradiation is preferably 100 mJ/cm$^2$ to 10000 mJ/cm$^2$, and more preferably 500 mJ/cm$^2$ to 7500 mJ/cm$^2$.

EXAMPLES

Hereinafter, the present disclosure will be described in more detail based on Examples, but the present disclosure is not limited to the following examples unless the gist thereof is overstepped.

First, an ink for forming an insulating layer and an ink for forming a conductive layer were prepared.

<Preparation of Ink 1 for Forming Insulating Layer>

4.0 g of 2-(dimethylamino)-2-(4-methylbenzyl)-1-(4-morpholinophenyl)-butan-1-one (trade name "Omnirad 379", manufactured by IGM Resins B.V.), 2.0 g of 2-isopropylthioxanthone (trade name "SPEEDCURE ITX" manufactured by LAMBSON Ltd.), 34.0 g of phenoxyethyl acrylate (manufactured by FUJIFILM Wako Pure Chemical Corporation), 22.0 g of N-vinylcaprolactam, 30.0 g of 1,6-hexanediol diacrylate, and 8.0 g of trimethylolpropane triacrylate (manufactured by FUJIFILM Wako Pure Chemical Corporation) were added to a resin beaker of 300 mL, and stirred using a mixer (trade name "L4R" manufactured by Silverson) at 25° C. under the condition of 5000 rpm for 20 minutes, thereby obtaining an ink 1 for forming an insulating layer.

<Preparation of Ink 2 for Forming Insulating Layer>

50.0 g of 3-methyl-3 {[(3-ethyloxetan-3-yl)methoxy]methyl}oxetane (trade name "OXT-221" manufactured by Toagosei Co., Ltd.), 15.0 g of 3',4'-epoxycyclohexylmethyl-3,4-epoxycyclohexane carboxylate (trade name "CELLOXIDE 2021P" manufactured by Daicel Corporation), 28.0 g of limonene dioxide (trade name "CELLOXIDE 3000" manufactured by Daicel Corporation), and 7.0 g of mixed triarylsulfonium hexafluorophosphate salts (manufactured by Sigma-Aldrich Co., LLC.) were added to a resin beaker of 300 mL, and stirred using a mixer (trade name "L4R" manufactured by Silverson) at 25° C. under the condition of 5000 rpm for 20 minutes, thereby obtaining an ink 2 for forming an insulating layer.

<Preparation of Ink for Forming Conductive Layer>

(Silver Complex Ink)

Isobutylammonium carbonate (6.08 g) and 15.0 g of isopropyl alcohol were added to a three-neck flask of 50 mL, and dissolved. Then, 2.0 g of silver oxide was added thereto and reacted at a normal temperature for 2 hours, thereby obtaining a homogeneous solution. Furthermore, 0.3 g of 2-hydroxy-2-methylpropylamine was added thereto and stirred, thereby obtaining a solution containing a silver complex. This solution was filtered using a membrane filter made of polytetrafluoroethylene (PTFE) having a pore diameter of 0.45 µm, thereby obtaining a silver complex ink.
(Silver Salt Ink)

40 g of silver neodecanoate was added to a three-neck flask of 200 mL. Next, 30.0 g of trimethylbenzene and 30.0 g of terpineol were added thereto and stirred, thereby obtaining a solution containing a silver salt. The obtained solution was filtered using a membrane filter made of polytetrafluoroethylene (PTFE) having a pore diameter of 0.45 µm, thereby obtaining a silver salt ink.
(Silver Particle Ink)
—Preparation of Silver Particle Dispersion 1—

As a dispersing agent, 6.8 g of polyvinylpyrrolidone (weight-average molecular weight of 3000 manufactured by Sigma-Aldrich Co., LLC.) was dissolved in 100 mL of water, thereby preparing a solution a. In addition, 50.00 g of silver nitrate was dissolved in 200 mL of water, thereby preparing a solution b. The solution a and the solution b were mixed together and stirred, thereby obtaining a mixed solution. At a room temperature, 78.71 g of an 85% by mass N,N-diethylhydroxylamine aqueous solution was added dropwise to the mixed solution. In addition, a solution obtained by dissolving 6.8 g of polyvinylpyrrolidone in 1000 ml of water was slowly added dropwise to the mixed solution at a room temperature. The obtained suspension was passed through an ultrafiltration unit (VIVAFLOW 50 manufactured by Sartorius Stedim Biotech GmbH, molecular weight cut-off: 100000, number of units: 4) and purified by being passed through purified water until about 5 L of exudate is discharged from a ultrafiltration unit. The supply of purified water was stopped, followed by concentration, thereby obtaining 30 g of a silver particle dispersion 1. The solid content in this dispersion was 50% by mass, and the content of silver in the solid content that was measured by TG-DTA (simultaneous measurement of thermogravimetry and differential thermal analysis) (manufactured by Hitachi High-Tech Corporation, model: STA 7000 series) was 96.0% by mass. The obtained silver particle dispersion 1 was diluted 20-fold with deionized water, and measured using a particle size analyzer FPAR-1000 (manufactured by Otsuka Electronics Co., Ltd) to obtain a volume average particle size of the silver particles. The volume average particle size of the silver particles in the silver particle dispersion 1 was 60 nm.
Preparation of Silver Particle Ink A1—

2 g of 2-propanol and 0.1 g of OLFINE E-1010 (manufactured by Nissin Chemical Industry Co., Ltd.) as a surfactant were added to 10 g of the silver particle dispersion, and water was added thereto such that the silver concentration reaches 40% by mass, thereby obtaining a silver particle ink.
<Preparation of Treatment Liquid>

Each component was mixed so as to have the content (% by mass) shown in Table 1 to prepare a treatment liquid. In Table 1, the term "other carboxylic acids" means carboxylic acids that do not correspond to the specific carboxylic acids.

Details of each component included in the treatment liquid are as follows.
—Monocarboxylic Acid—
  Abietic acid (manufactured by Tokyo Chemical Industry Co., Ltd.)
  Isopimaric acid (manufactured by Sigma-Aldrich Co., LLC.)
  Lignoceric acid (manufactured by Tokyo Chemical Industry Co., Ltd.)
—Dicarboxylic Acid—
  Succinic acid (manufactured by FUJIFILM Wako Pure Chemical Corporation)
  Glutaric acid (manufactured by FUJIFILM Wako Pure Chemical Corporation)
—Other Carboxylic Acids—
  Polyacrylic acid (manufactured by FUJIFILM Wako Pure Chemical Corporation, weight-average molecular weight: 5000)
—Solvent—
  Isopropanol (manufactured by FUJIFILM Wako Pure Chemical Corporation)
  Methyl ethyl ketone (manufactured by FUJIFILM Wako Pure Chemical Corporation)

TABLE 1

| | | Molecular weight | Treatment liquid 1 | Treatment liquid 2 | Treatment liquid 3 | Treatment liquid 4 | Treatment liquid 5 | Treatment liquid 6 | Treatment liquid 7 |
|---|---|---|---|---|---|---|---|---|---|
| Monocarboxylic acid | Abietic acid | 302.45 | 10 | 7 | — | — | 8 | — | — |
| | Isopimaric acid | 302.45 | — | 3 | — | — | — | — | — |
| Dicarboxylic acid | Succinic acid | 118.09 | — | — | 10 | — | 2 | — | — |
| | Glutaric acid | 132.12 | — | — | — | 10 | — | — | — |
| Other carboxylic acids | Lignoceric acid | 368.63 | — | — | — | — | — | 10 | — |
| | Polyacrylic acid | | — | — | — | — | — | — | 10 |
| Solvent | Isopropanol | | 90 | 70 | 90 | 80 | 50 | 20 | 50 |
| | Methyl ethyl ketone | | — | 20 | — | 10 | 40 | 70 | 40 |

Examples 1 to 8 and Comparative Examples 1 to 4

—Preparation of Electronic Substrate—

The shielding can and the frame of the LTE module manufactured by Quectel, Inc. were removed. After removing a solder of a metal wire on the substrate where the shielding can and the frame were bonded, the flux was removed using a flux washing agent for a print substrate (trade name "goat BS-W20B"), thereby obtaining an electronic substrate A. A plurality of electronic components and a discontinuous frame-shaped ground electrode to surround the plurality of electronic components are formed on the electronic substrate A.

After that, the treatment liquid was applied onto the ground electrode of the electronic substrate A and then dried at 100° C. for 5 minutes using an oven, thereby obtaining an electronic substrate B. In Comparative Example 3 and Comparative Example 4, the step of applying the treatment liquid was not executed.

—Formation of Insulating Layer—

An ink cartridge (for 10 picoliters) of an ink jet recording device (trade name "DMP-2850" manufactured by Fujifilm Dimatix Inc.) was filled with the ink for forming an insulating layer. As image recording conditions, the amount of droplets was set to 10 picoliters per dot. Image data of the same region as a region surrounded by the ground electrode in the electronic substrate was prepared. Using this image data, a cycle of applying the ink for forming an insulating layer and irradiating the ink for forming an insulating layer with ultraviolet rays was repeated until the electronic components disposed on the substrate were covered.

The irradiation with ultraviolet rays was performed by using an ultraviolet irradiation device (trade name "UV SPOT CURE OmniCure S2000" manufactured by Lumen Dynamics Group Inc.) installed next to the ink jet head. The illuminance of the ultraviolet rays was set to 8 W/cm$^2$ and the irradiation was performed for 0.1 seconds per irradiation, so that the exposure amount per exposure was 0.8 J/cm$^2$. In addition, a time from the time point at which the ink for forming an insulating layer is applied to the start of the irradiation with ultraviolet rays occurred was set to 0.3 seconds.

—Formation of Conductive Layer—

An ink cartridge (for 10 picoliters) of an ink jet recording device (trade name "DMP-2850" manufactured by Fujifilm Dimatix Inc.) was filled with the ink for forming a conductive layer. As image recording conditions, the resolution was set to 1270 dots per inch (dpi), and the amount of droplets was set to 10 picoliters per dot. The electronic substrate on which the insulating layer was formed was preheated to 60° C.

Image data of a region that covers the ground electrode and the insulating layer in the electronic substrate was prepared. Using this image data, a cycle of applying the ink for forming a conductive layer and heating the ink for forming a conductive layer at 180° C. for 60 minutes using an oven was repeated 8 times. An electronic device in which a conductive layer having metallic gloss was formed was obtained.

The adhesiveness, the electromagnetic wave-shielding properties, and the outflow of the ink for forming a conductive layer were evaluated using the manufactured electronic device.

<Adhesiveness>

Using the obtained electronic substrate, a cycle test was performed at a temperature from −15° C. to 90° C. for 1000 cycles. After the cycle test, the presence or absence of peeling of the conductive layer from the ground electrode and the presence or absence of deformation of the conductive layer were observed, and the adhesiveness was evaluated based on the observation details. The evaluation standards are as follows.

5: There was no peeling of the conductive layer, and there was no deformation of the conductive layer.

4: There was no peeling of the conductive layer, and deformation of the conductive layer could not be visually confirmed but was confirmed through microscopic observation.

3: There was no peeling of the conductive layer, but deformation of the conductive layer was visually confirmed.

2: There was slight peeling of the conductive layer.

1: The conductive layer was peeled off by half or more.

<Electromagnetic Wave-Shielding Properties>

The communication of the obtained electronic substrate was made with LTE BAND 13, and near magnetic field measurement was executed at a frequency of 777 MHz using a near magnetic field measuring device (trade name "SmartScan 550" manufactured by API Corporation). A noise suppression level was measured, and the electromagnetic wave-shielding properties were evaluated based on the noise suppression level.

<Position Accuracy of Conductive Layer>

In the obtained electronic substrate, in a case in which an outer edge portion of the conductive layer was located outside a region that includes the ground electrode and is surrounded by the ground electrode, the conductive layer was determined to protrude from the ground electrode. In a case in which the conductive layer protruded from the ground electrode, a distance by which the conductive layer protruded from the ground electrode (hereinafter, also referred to as a "protruding distance") was measured. Specifically, each of central portions of four sides of the ground electrode formed in a frame shape was observed at a magnification of 50× using a laser microscope (trade name "VK-9710" manufactured by Keyence Corporation). At three positions in the observation field, a distance to the outer edge portion of the conductive layer was measured with reference to a side surface of the ground electrode opposite to the ground region. Then, an average value of the protruding distances measured at 12 positions was calculated. The position accuracy of the conductive layer was evaluated based on the average value of the protruding distances. The evaluation standards are as follows.

5: The conductive layer did not protrude from the ground electrode.

4: The average value of the protruding distances was more than 0 μm and 2 μm or less.

3: The average value of the protruding distances was more than 2 μm and 5 μm or less.

2: The average value of the protruding distances was more than 5 μm and 10 μm or less.

1: The average value of the protruding distances was more than 10 μm.

The evaluation results are shown in Tables 2 and 3. In Tables 2 and 3, the term "specific carboxylic acid" means at least one compound selected from the group consisting of a monocarboxylic acid and a dicarboxylic acid having a molecular weight of less than 350. The term "other carboxylic acids" means carboxylic acids that do not correspond to the specific carboxylic acids. The insulating ink 1 means "ink 1 for forming an insulating layer", and the insulating ink 2 means "ink 2 for forming an insulating layer".

TABLE 2

| Treatment liquid | Type | Example 1 | Example 2 | Example 3 | Example 4 | Example 5 | Example 6 | Example 7 | Example 8 |
|---|---|---|---|---|---|---|---|---|---|
| | | Treatment liquid 1 | Treatment liquid 2 | Treatment liquid 3 | Treatment liquid 4 | Treatment liquid 5 | Treatment liquid 5 | Treatment liquid 3 | Treatment liquid 5 |
| | Specific carboxylic acid | Abietic acid | Abietic acid | Succinic acid | Glutaric acid | Abietic acid | Abietic acid | Succinic acid | Abietic acid |
| | | — | Isopimaric acid | — | — | Succinic acid | Succinic acid | — | Succinic acid |

TABLE 2-continued

|  |  | Example 1 | Example 2 | Example 3 | Example 4 | Example 5 | Example 6 | Example 7 | Example 8 |
|---|---|---|---|---|---|---|---|---|---|
|  | Other carboxylic acids | — | — | — | — | — | — | — | — |
| Ink for forming insulating layer | Type | Insulating ink 1 | Insulating ink 1 | Insulating ink 1 | Insulating ink 1 | Insulating ink 1 | Insulating ink 2 | Insulating ink 1 | Insulating ink 1 |
| Ink for forming conductive layer | Type | Silver complex ink | Silver complex ink | Silver complex ink | Silver complex ink | Silver complex ink | Silver complex ink | Silver particle ink | Silver salt ink |
| Evaluation | Adhesiveness | 3 | 4 | 5 | 5 | 5 | 5 | 4 | 5 |
|  | Electromagnetic wave-shielding property | −30 | −30 | −35 | −30 | −30 | −30 | −30 | −30 |
|  | Position accuracy of conductive layer | 4 | 4 | 5 | 5 | 5 | 4 | 3 | 5 |

TABLE 3

|  |  | Comparative Example 1 | Comparative Example 2 | Comparative Example 3 | Comparative Example 4 |
|---|---|---|---|---|---|
| Treatment liquid | Type | Treatment liquid 6 | Treatment liquid 7 | — | — |
|  | Specific carboxylic acid | — | — | — | — |
|  | Other carboxylic acids | Lignoceric acid | Polyacrylic acid | — | — |
| Ink for forming insulating layer | Type | Insulating ink 1 | Insulating ink 1 | Insulating ink 1 | Insulating ink 1 |
| Ink for forming conductive layer | Type | Silver complex ink | Silver complex ink | Silver complex ink | Silver particle ink |
| Evaluation | Adhesiveness | 2 | 2 | 1 | 1 |
|  | Electromagnetic wave-shielding property | −20 | −20 | −10 | −10 |
|  | Position accuracy of conductive layer | 2 | 2 | 1 | 3 |

As shown in Table 2, in Examples 1 to 8, it was found that a step of preparing an electronic substrate including a wiring board, an electronic component disposed on the wiring board, and a ground electrode having an organic acid on a surface thereof and a step of applying an ink for forming a conductive layer onto at least a part of the ground electrode having the organic acid on the surface thereof, to form a conductive layer that is a cured film of the ink for forming a conductive layer are provided, and the organic acid includes at least one compound selected from the group consisting of a monocarboxylic acid having a molecular weight of less than 350 and a dicarboxylic acid having a molecular weight of less than 350, so that the adhesiveness between the ground electrode and the conductive layer was excellent.

On the other hand, in Comparative Examples 1 and 2, since a treatment liquid containing no specific carboxylic acid was used, the adhesiveness between the ground electrode and the conductive layer was insufficient.

In addition, in Comparative Examples 3 and 4, it was found that since no organic acid was present on the surface of the ground electrode, the adhesiveness between the ground electrode and the conductive layer was poor.

The entire disclosure of Japanese Patent Application No. 2021-139985, filed Aug. 30, 2021, is incorporated into the present specification by reference. In addition, all documents, patent applications, and technical standards described in the present specification are incorporated in the present specification by reference, to the same extent as in the case where each of the documents, patent applications, and technical standards is specifically and individually described.

What is claimed is:

1. A manufacturing method of an electronic device, the method comprising:
    preparing an electronic substrate including a wiring board, an electronic component disposed on the wiring board, and a ground electrode having an organic acid on a surface thereof; and
    applying an ink for forming a conductive layer onto at least a part of the ground electrode having the organic acid on the surface thereof, to form a conductive layer that is a cured film of the ink for forming a conductive layer,
    wherein the organic acid includes at least one compound selected from the group consisting of a monocarboxylic acid having a molecular weight of less than 350 and a dicarboxylic acid having a molecular weight of less than 350.

2. The manufacturing method of an electronic device according to claim 1,
    wherein the dicarboxylic acid is succinic acid, glutaric acid, or adipic acid.

3. The manufacturing method of an electronic device according to claim 1,
    wherein the monocarboxylic acid is abietic acid.

4. The manufacturing method of an electronic device according to claim 1,
wherein the organic acid includes at least one compound selected from the group consisting of succinic acid, glutaric acid, and abietic acid.

5. The manufacturing method of an electronic device according to claim 1, further comprising:
forming an insulating layer that is in contact with the ground electrode and covers the electronic component,
wherein, in the forming the conductive layer, the ink for forming a conductive layer is applied onto the insulating layer and at least a part of the ground electrode having the organic acid on the surface thereof.

6. The manufacturing method of an electronic device according to claim 5,
wherein the forming an insulating layer is an applying an ink for forming an insulating layer and irradiating the ink for forming an insulating layer with an active energy ray to form an insulating layer that is a cured film of the ink for forming an insulating layer.

7. The manufacturing method of an electronic device according to claim 5,
wherein the insulating layer contains an acrylic resin or an epoxy resin.

8. The manufacturing method of an electronic device according to claim 1,
wherein the ink for forming a conductive layer contains a metal complex or a metal salt.

\* \* \* \* \*